(12) United States Patent
Morohoshi

(10) Patent No.: US 7,382,446 B2
(45) Date of Patent: Jun. 3, 2008

(54) ABERRATION MEASURING METHOD

(75) Inventor: Hiroshi Morohoshi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 272 days.

(21) Appl. No.: 11/100,314

(22) Filed: Apr. 5, 2005

(65) Prior Publication Data

US 2005/0219515 A1 Oct. 6, 2005

(30) Foreign Application Priority Data

Apr. 6, 2004 (JP) ............................. 2004-112170

(51) Int. Cl.
*G01B 9/00* (2006.01)

(52) U.S. Cl. ..................... 356/124; 250/548; 355/53; 430/30

(58) Field of Classification Search ........ 356/124–127, 356/399–401, 121–123; 250/548; 430/22, 430/30; 355/77, 53, 55, 67
See application file for complete search history.

(56) References Cited

U.S. PATENT DOCUMENTS

| | | | |
|---|---|---|---|
| 5,828,455 A | 10/1998 | Smith et al. | 356/354 |
| 5,978,085 A | 11/1999 | Smith et al. | 356/354 |
| 6,245,470 B1 * | 6/2001 | Kamon | 430/30 |
| 6,295,122 B1 | 9/2001 | Schultz et al. | |
| 6,633,390 B2 * | 10/2003 | Shiode et al. | 356/620 |
| 6,730,925 B1 * | 5/2004 | Ozawa | 250/548 |
| 6,960,415 B2 * | 11/2005 | Shiode | 430/30 |
| 6,982,786 B2 * | 1/2006 | Shiode | 356/121 |
| 7,190,443 B2 * | 3/2007 | Shiode | 356/124 |
| 7,193,713 B2 * | 3/2007 | Shiode | 356/399 |
| 2002/0015158 A1 | 2/2002 | Shiode et al. | |
| 2002/0021434 A1 | 2/2002 | Nomura et al. | 355/55 |
| 2002/0054283 A1 * | 5/2002 | Kato et al. | 355/55 |
| 2002/0159040 A1 * | 10/2002 | Hamatani et al. | 355/52 |
| 2003/0091913 A1 | 5/2003 | Shiode | |
| 2003/0133099 A1 | 7/2003 | Shiode | 356/124 |
| 2005/0128447 A1 * | 6/2005 | Shiode | 355/52 |
| 2007/0046929 A1 * | 3/2007 | Shiode | 356/124 |

FOREIGN PATENT DOCUMENTS

| | | |
|---|---|---|
| JP | 3297423 | 12/1991 |
| JP | 2002-289494 A | 10/2002 |
| JP | 2003-178968 A | 6/2003 |
| WO | WO/03/021352 A1 | 3/2003 |

* cited by examiner

*Primary Examiner*—Hoa Q Pham
(74) *Attorney, Agent, or Firm*—Morgan & Finnegan, LLP

(57) ABSTRACT

Disclosed is a method of measuring aberration of a projection optical system, that includes an illuminating step for illuminating a reticle by use of light from a light source and through an illumination optical system, a projecting step for projecting an image of a test pattern formed on the reticle, upon a substrate through the projection optical system, a measuring step for measuring a positional deviation amount of the image of the test pattern, and a determining step for determining the aberration of the projection optical system on the basis of the positional deviation amount measured at the measuring step, wherein the projecting step includes a shaping step for shaping the light by use of shaping means disposed in one of the illumination optical system and the projection optical system and a light blocking pattern formed on a surface of the reticle, remote from a surface of the reticle where the test pattern is formed, so that the light passes only through a predetermined region of a pupil of the projection optical system.

11 Claims, 23 Drawing Sheets

ABERRATION MEASURING METHOD

FIELD OF THE INVENTION AND RELATED ART

This invention relates to an aberration measuring method which is suitably usable for measurement of aberration such as wavefront aberration or focus, for example, of a projection optical system of a projection exposure apparatus, for example, used in a lithographic process for manufacture of semiconductor devices, liquid display devices, thin-film magnetic heads, etc.

The manufacture of semiconductor devices, liquid crystal display devices, thin-film magnetic heads, etc. based on a lithographic process uses a projection exposure apparatus which is arranged to project an image of a pattern of a reticle (mask) onto a photosensitive substrate to expose the same with the pattern image. The projection optical system (projection lens) of such projection exposure apparatus involves aberration, and the influence of the aberration upon the device pattern is currently a serious problem. Measurement of lens aberration is therefore very important. On the other hand, very strict requirements are applied in regard to aberration of a projection lens, as a matter of course, and the number of inspection points is increasing in these years. Thus, not only improvements of inspection precision but also reduction of inspection time is very important issue.

Particularly, as regards semiconductor devices, there is a strong need for improvements of device performance by miniaturizing the pattern that forms the device. According to the roadmap of ITRS (International Technology Roadmap for Semiconductors) which is a standard technological roadmap for semiconductor devices, the device pattern miniaturization is set forth every two years. Till the first half of 1990s, the pattern size of semiconductor devices was greater than the exposure wavelength of projection exposure apparatus and, in order to meet the requirements of pattern miniaturization, the exposure light source of the projection exposure apparatus was changed to shorten the exposure wavelength. In the second half of 1990s, a pattern size less than the exposure wavelength was required and semiconductor devices were manufactured on the basis of super resolution technology. Since the imaging performance where super resolution technology is used is extraordinarily sensitive to the aberration of a projection lens, an extremely low-aberration projection lens, less than $5/1000$ of exposure wavelength, is necessary.

On the other hand, in the super resolution technology, in order to assure a resolving power less than the exposure wavelength, only a portion of diffraction light produced by a pattern of a reticle is used to produce a projected image or, alternatively, the resolving power is enhanced on the basis of a phase difference of light passed through the reticle pattern. As a result, although it depends on the shape of the pattern, only a particular aberration among various aberrations of the projection lens may cause a large influence upon the shape of the imaged pattern, being projected on a wafer. Therefore, it is necessary also to adjust the aberration of the projection lens very precisely in accordance with the shape of the reticle pattern.

In this connection, many methods have been proposed and used in practice for measurement of aberrations such as spherical aberration, image plane (field curvature), astigmatism, coma, wavefront aberration, etc., in practical inspection or evaluation. In these aberration measurements, Zernike coefficient is surely the wavefront aberration and, in lens manufacturing factories, generally it is measured by use of an interferometer such as PMI (Phase Measurement Interferometer). However, once a projection exposure apparatus is assembled, due to limitation of space or the like it is very difficult to measure the aberration, by use of an interferometer, at the position where the projection exposure apparatus is being fixed. It is therefore desirable to measure the wavefront aberration without using an interferometer.

Generally, regarding the wavefront aberration, by approximation using Zernike polynomial or the like, typical aberrations such as spherical aberration, field curvature, astigmatism and coma which are factors of the wavefront aberration can be calculated. On the other hand, simulations to actual device patterns using Zernike coefficient are fed back in many applications to a mask and a process and yet to an exposure apparatus itself. Thus, it has wide versatility, and measuring Zernike coefficient inside the projection exposure apparatus is therefore surely desired.

Japanese Laid-Open Patent Application, Publication No. 2003-178968 (corresponding to Published U.S. patent application, Publication No. 2003/091913A1) shows an example of wavefront aberration measuring method. In this method, only an aberration that corresponds to the coefficient of a desired term of Zernike polynomial (i.e., Zernike coefficient) can be selectively measured. This method uses a stop having a special shape having been determined by calculation, as well as a box-in-box pattern on a mask. The shape of the stop used in this method is determined beforehand by calculation to ensure that an error of the imaging position, of a box-like mark of the mask, by the projection lens depends mainly on a change of a particular Zernike coefficient. Thus, by measuring the error of the imaging position of the box-like mark being projected on a wafer with the use of this special stop, with reference to the imaging position of another box-like mark projected on the wafer without the use of the special stop, the aberration of the projection lens corresponding to the desired Zernike coefficient can be calculated.

Although the method disclosed in Japanese Laid-Open Patent Application, Publication No. 2003-178968 has an advantage that a desired Zernike coefficient can be detected accurately on the basis of measurements at two to four points, many stops have to be prepared or a single stop has to be rotated many times to ensure precise detection of Zernike coefficient. This takes a long time for preparation of measurement samples.

SUMMARY OF THE INVENTION

It is accordingly an object of the present invention to provide an aberration measuring method by which a Zernike coefficient can be calculated with simplified and convenient measurement sample preparation operations.

It is another object of the present invention to provide an aberration measuring method by which a Zernike coefficient can be calculated in short measurement time without the necessity of sample measurement and special measuring machine.

In accordance with an aspect of the present invention, there is provided a method of measuring aberration of a projection optical system, comprising: an illuminating step for illuminating a reticle by use of light from a light source and through an illumination optical system; a projecting step for projecting an image of a test pattern formed on the reticle, upon a substrate through the projection optical system; a measuring step for measuring a positional deviation amount of the image of the test pattern; and a determining step for determining the aberration of the projection optical system on the basis of the positional deviation amount measured at said measuring step; wherein said projecting step includes a shaping step for shaping the light by use of shaping means disposed in one of the illumination optical system and the projection optical system and a light blocking pattern formed on a surface of the reticle, remote from a surface of the reticle where the test pattern is formed, so that the light passes only through a predetermined region of a pupil of the projection optical system.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
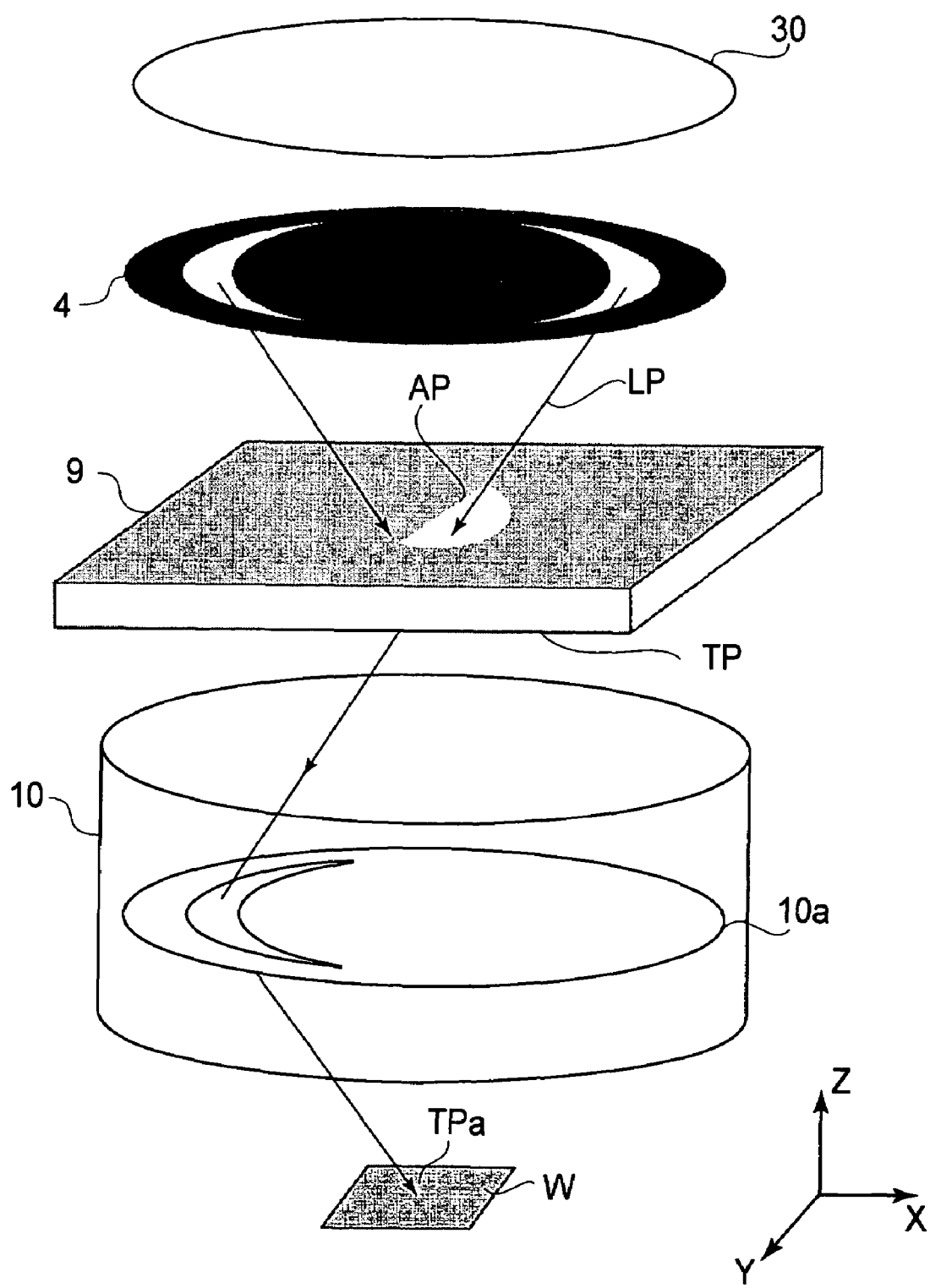
FIG. 1 is a schematic view of a main portion of a projection exposure apparatus according to a first embodiment of the present invention.

First of all, the manner of measuring a Zernike coefficient will be described.

In regard to the Zernike coefficient measurement to be carried out inside the major assembly of a projection exposure apparatus, particularly, regarding the type in which a positional deviation of an image of a pattern corresponding to a pupil plane of a projection lens is measured over the whole pupil plane and the Zernike coefficient is calculated on the basis of it, several problems have been pointed out as follows. Since the Zernike polynomial (Zernike) is orthogonal polynomial, generally the Zernike terms thereof are not mutually influential to each other. Namely, the Zernike coefficient of each Zernike term can be calculated independently, and the calculation can be done by adding higher-order terms infinitely. However, to make use of this advantage, the aggregation of discrete measurement points must satisfy the orthogonal condition, and this is really a limitation. Any methods not confined to the orthogonality will therefore be discussed below.

In practice, any terms which may be mainly influential to the imaging performance are lower-order terms. Even if the influence of higher-order terms should be considered in future because of further miniaturization of devices, thirty-six terms currently being discussed would be sufficient. Although there seems to be no particular reason for setting the limit to the thirty-six terms, it would be enough to consider up to those higher-order terms by which, in comparison with lower-order Zernike term components of practical projection optical systems, the higher-order components thereof can be regarded as being sufficiently small. It can be stated in other words that, in the measurement based on approximation calculation without an orthogonal system, the approximation calculation is carried limitedly only up to those higher-order terms which might be influential to lower-order coefficients in question.

Table 1 below shows numerical formula expressions of Zernike thirty-six terms, wherein symbol C represents each Zernike coefficient and the numeral following the symbol "C" denotes the term number.

TABLE 1

| | m | n | Wrms/1 | $R_n^m(r)$ | | |
|---|---|---|---|---|---|---|
| C1 | 0 | 0 | 1 | 1 | | |
| C2 | 1 | 1 | 0.5 | r | Cos θ | DistX |
| C3 | 1 | 1 | 0.5 | | Sin θ | DistY |
| C4 | 0 | 2 | 0.5774 | $2r^2 - 1$ | | Defocu |
| C5 | 2 | 2 | 0.4082 | $r^2$ | Cos2 | As-SM |
| C6 | 2 | 2 | 0.4082 | | Sin2 | As-HV |
| C7 | 1 | 3 | 0.3536 | $3r^3 - 2r$ | Cos θ | ComaX |
| C8 | 1 | 3 | 0.3536 | | Sin θ | ComaY |
| C9 | 0 | 4 | 0.4472 | $6r^4 - 6r^2 + 1$ | | SA |
| C10 | 3 | 3 | 0.3536 | $r^3$ | Cos3 | 3leaf- |
| C11 | 3 | 3 | 0.3536 | | Sin3 | |
| C12 | 2 | 4 | 0.3162 | $4r^4 - 3r^2$ | Cos2 | As-SM |
| C13 | 2 | 4 | 0.3162 | | Sin2 | As-HV |
| C14 | 1 | 5 | 0.2887 | $10r^5 - 12r^3 + 3r$ | Cos θ | ComaX |
| C15 | 1 | 5 | 0.2887 | | Sin θ | ComaY |
| C16 | 0 | 6 | 0.378 | $20r^6 - 30r^4 + 12r^2 - 1$ | | SA |
| C17 | 4 | 4 | 0.3162 | $r^4$ | Cos4 | |
| C18 | 4 | 4 | 0.3162 | | Sin4 | |
| C19 | 3 | 5 | 0.2887 | $5r^5 - 4r^3$ | Cos3 | 3leaf- |
| C20 | 3 | 5 | 0.2887 | | Sin3 | |
| C21 | 2 | 6 | 0.2673 | $15r^6 - 20r^4 + 6r^2$ | Cos2 | As-SM |
| C22 | 2 | 6 | 0.2673 | | Sin2 | As-HV |
| C23 | 1 | 7 | 0.25 | $35r^7 - 60r^5 + 30r^3 - 4r$ | Cos θ | ComaX |
| C24 | 1 | 7 | 0.25 | | Sinθ | ComaY |
| C25 | 0 | 8 | 0.3333 | $70r^8 - 140r^6 + 90r^4 - 20r^2 + 1$ | | SA |
| C26 | 5 | 5 | 0.2887 | $r^5$ | Cos5 | |
| C27 | 5 | 5 | 0.2887 | | Sin5 | |
| C28 | 4 | 6 | 0.2673 | $6r^6 - 5r^4$ | Cos4 | |
| C29 | 4 | 6 | 0.2673 | | Sin4 | |
| C30 | 3 | 7 | 0.25 | $21r^7 - 30r^5 + 10r^3$ | Cos3 | 3leaf- |
| C31 | 3 | 7 | 0.25 | | Sin3 | |
| C32 | 2 | 8 | 0.2357 | $56r^8 - 105r^6 + 60r^4 - 10r^2$ | Cos2 | As-SM |
| C33 | 2 | 8 | 0.2357 | | Sin2 | As-HV |
| C34 | 1 | 9 | 0.2236 | $126r^9 - 280r^7 + 210r^5 -$ | Cos θ | ComaX |
| C35 | 1 | 9 | 0.2236 | | Sin θ | ComaY |
| C36 | 0 | 10 | 0.3015 | $252r^{10} - 630r^8 + 560r^6 - 210r^4 + 30r^2 - 1$ | | SA |
| (C49) | 0 | 12 | 0.2774 | | | SA |

If it is assumed that the wavefront of the projection lens can be all expressed by use of the thirty-six terms above, fitting is possible by using all the thirty-six terms.

$$\begin{bmatrix} S_1 \\ S_2 \\ \vdots \\ S_q \end{bmatrix} = \begin{bmatrix} Z_1(r_1, è_1) & Z_2(r_1, è_1) & \cdots & Z_{36}(r_1, è_1) \\ Z_1(r_2, è_2) & Z_2(r_2, è_2) & \cdots & Z_{36}(r_2, è_2) \\ \vdots & \vdots & \cdots & \vdots \\ Z_1(r_q, è_q) & Z_2(r_1, è_q) & \cdots & Z_{36}(r_q, è_2) \end{bmatrix} \begin{bmatrix} C_1 \\ C_2 \\ \vdots \\ C_{36} \end{bmatrix} \quad (1)$$

Alternatively, $$\bar{s} = Z \cdot \bar{c}$$

Here, $S_1$ is an idealistic positional deviation (i=1 to q), (r, θ) is pupil polar coordinates, $Z_j$ is Zernike or Zernike derived-function term (j=1 to 36), and $C_j$ is Zernike coefficient.

The determinant (1) above should be solved and, actually, there would be an error involved in the measured value $S_i$. Furthermore, the solution $C_j$ may be influenced by data missing or by difference in the sampling manner (the number and/or the position of measurement points) for the measurement points (ri, θi) (i=1 to q) due to the difference of measuring method or any changes in the measurement method condition (design), or the like.

$$\bar{s}' = Z' \cdot \bar{c}'$$

In terms of determinant, it is seen that there occur changes of matrix Z and vector S, such as:

$$Z \to Z'$$

$$S \to S'$$

Consequently, a different result is outputted for vector c, such as:

$$c \to c'$$

The problem described above may be an inconvenience involved commonly in the measuring methods discussed hereinbefore. In order to avoid such inconvenience, it is desirable to hold the matrix Z fixed. Furthermore, since the matrix Z does not satisfy the orthogonal condition, the measurement method itself should desirably involve a configuration such as diagonal matrix by which the solution can be determined definitely.

$$\begin{bmatrix} S_1 \\ S_2 \\ \vdots \\ S_q \end{bmatrix} = \begin{bmatrix} \lambda_1 & 0 & 0 & \cdots & 0 \\ 0 & \lambda_2 & 0 & \cdots & 0 \\ \vdots & \vdots & \vdots & \cdots & \vdots \\ 0 & 0 & 0 & \cdots & 0 \\ 0 & 0 & 0 & \cdots & \lambda_{36} \end{bmatrix} \cdot \begin{bmatrix} C_1 \\ C_2 \\ \vdots \\ C_{36} \end{bmatrix}$$

Here, while taking a particular note only to the matrix vector $(\lambda_1, 0, 0, \ldots, 0)$ of the diagonal matrix set forth above, optimization based on the following formulae is considered.

$$\lambda_1 = \sum_k W_k \cdot Z_1(r_k, è_k) \quad (2)$$

$$0 = \sum_k W_k \cdot Z_2(r_k, è_k)$$

$$\vdots$$

$$0 = \sum_k W_k \cdot Z_{36}(r_k, è_k)$$

where W is standardized weight coefficient, k is pupil plane measurement position, and $Z(r_k, \theta_k)$ is Zernike sensitivity.

The simultaneous equations (2) above mean that, if, in relation to each Zernike term, the amount of change of positional deviation of the image upon the imaging plane at an arbitrary position k that corresponds to the pupil coordinates of the projection lens to be measured is predetected (i.e., Zernike sensitivity), equations (2) can be satisfied by optimizing the weight coefficient Wk and the pupil region k. Thus, once a measurement method that satisfies equations (2) above is established, the positional deviation amount S1 of the image functions to independently measure the Zernike coefficient of only one term of the projection optical system to be measured.

$$S_x = \left[ \sum_k W_k \cdot Z_1(r_k, è_k) \sum_k W_k \cdot Z_2(r_k, è_k) \ldots \sum_k W_k \cdot Z_{36}(r_k, è_k) \right] \cdot \begin{bmatrix} C_1 \\ C_2 \\ \vdots \\ C_{36} \end{bmatrix}$$

Similarly, regarding the other Zernike terms, by optimizing the weight coefficient Wk and the pupil region k, their Zernike coefficients can be extracted independently of each other. Thus, by measuring Zernike coefficients under different measurement conditions (weight coefficients Wk and pupil regions k), a measurement method by which Zernike terms are kept independent from each other and they do not interfere with each other is accomplished.

Here, the relationship between the image positional deviation and the Zernike sensitivity will be described. The slope of a wavefront or the phase difference thereof can be expressed in terms of its pupil position and Zernike coefficient. Therefore, the positional deviation of an image produced by them is in a linear relationship with the slope of the wavefront or the phase difference thereof at the position (very small region) of the light, actually passing through the pupil plane in the imaging operation.

$$S1 = g \cdot \Sigma Ci \cdot Zi(x1, y1) \quad (3)$$

wherein S1 is the positional deviation with respect to the pupil coordinates (x1, y1), g is a constant, Ci is the Zernike coefficient, and Zi(x,y) is the Zernike sensitivity of i-th term at the pupil position (x,y).

From equation (3) above, it follows that, where various incoherent lights similarly pass through different pupil positions and they are imaged, a resultant combined image $S_T$ is, from its linearity, as follows:

$$\begin{aligned} S_T &= \Sigma Wk \cdot Sk \quad (4) \\ &= \Sigma Wk \, \Sigma g \cdot Ci \cdot Zi(xk, yk) \\ &= g \Sigma Ci \, \Sigma Wk \cdot Zi(xk, yk) \end{aligned}$$

It is seen from equation (4) that the positional deviation of the image corresponds to the ground sum of positional deviations Sk at the respective small pupil regions and that, in regard to a particular Zernike term, it corresponds to the product of the sum of the Zernike sensitivities at respective pupil positions k as multiplied by the Zernike coefficient. Therefore, by optimizing the sum of the Zernike sensitivities at the pupil positions, measurement of a desired Zernike coefficient is enabled.

Now, preferred embodiments of the present invention will be described below with reference to the attached drawings.

Embodiment 1

FIG. 1 is a schematic view of a main portion of a projection exposure apparatus according to a first embodiment of the present invention. In FIG. 1, a reticle 9 has a pattern or pattern group (test pattern) TP formed thereon. The test pattern TP is illuminated with illumination light LP through an aperture stop (σ stop) 4 of special shape, being provided as shaping means at a pupil plane of an illumination optical system, as well as a light blocking pattern AP provided on a reticle base surface (bottom surface) remote from the reticle 9 surface where the test pattern TP is formed. An image of the test pattern TP of the reticle 9 is projected by a projection lens 10. Then, the position of an aerial image being imaged or of a pattern image TPa transferred onto a photosensitive substrate W is measured. It should be noted that the test pattern TP and/or the light blocking pattern AP may not be formed on the bottom surface of the reticle but rather they may be formed on a separate reference plate which may be accommodated into the projection exposure apparatus.

Figure 3A:
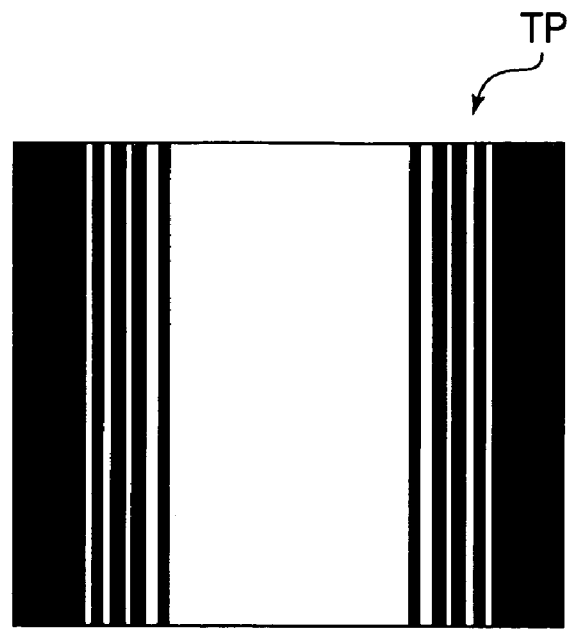
FIG. 3A is an enlarged view of a portion of a test pattern.
Figure 3B:
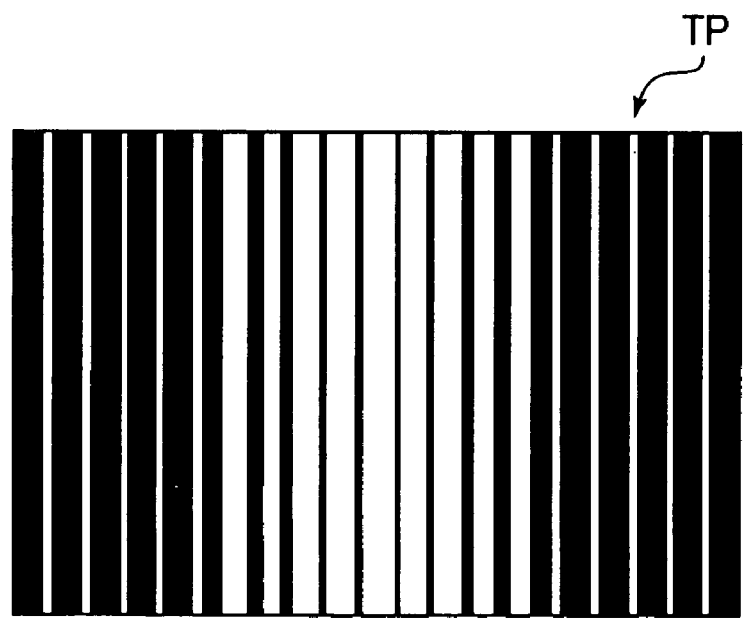
FIG. 3B illustrates an example of test pattern.

As best shown in FIGS. 3A and 3B, the test pattern TP may comprise a periodic pattern having approximately regular line pitch or space pitch (intervals). More specifically, it has a special shape that the widths of the spaces through which light can pass are decreasing in an order from the center line (or central space) to the outside thereof. Details of such pattern are disclosed in International Publication, No. WO03/021352 or Published U.S. patent application, Publication No. 2003/133099A1. This pattern has a characteristic that diffraction light of the light passed through the pattern is very small as compared with ordinary space pattern. Because of such characteristic, the limited region on the projection lens pupil plane through which the light LP passes has a shape the same as the shape of the illumination light effective light source to be defined by the aperture stop mentioned above.

The shape of the effective light source 30 of the illumination light, illuminating the test pattern TP of the reticle 9, is determined by the aperture stop 4 and the light blocking pattern AP. The illumination light emitted from the light source reaches the aperture stop 4 by which a portion of the illumination light is intercepted by the aperture stop 4. Thus, an effective light source corresponding to the aperture shape of the aperture stop 4 is defined. The illumination light having an effective light source shape as defined by the aperture stop 4 is subsequently blocked by the light blocking pattern AP provided on the bottom face of the reticle. Thus, the effective light source shape of illumination light that finally illuminates the test pattern TP is one that corresponds to a portion of the shape defined by the aperture stop 4 which portion can pass through the light blocking pattern AP.

In FIG. 1, the shape of the effective light source as defined by the illumination light from the light source is circular. By means of the aperture stop 4, it is transformed into a pair of crescent shapes. Thereafter, by means of the light blocking pattern AP at the reticle bottom surface, one of the crescent shapes is blocked. Thus, the shape of effective light source that illuminates the test pattern TP corresponds to the right-hand side crescent shape.

The test pattern TP reduces diffraction light by which, at the pupil plane 10a of the projection lens 10 and as shown in the drawing, a light intensity distribution that is equivalent to the effective light source shape, being produced by the aperture stop 4 shape and the light blocking pattern PA of the reticle bottom face, can be produced. On the other hand, the light intensity distribution of the pattern image TPa having been imaged through the projection lens 10 can be regarded as a single large pattern of small distortion, wherein lines are unresolved. This aerial image or the pattern image TPa transferred onto the photosensitive substrate is measured as a positional deviation from a certain reference. The effective light source shape as defined in accordance with the aperture shape of the aperture stop 4 and the light blocking pattern AP at the bottom surface of the reticle is determined through the optimization having been made in regard to a particular Zernike term or terms, on the basis of positional deviation of the pattern image TPa having been determined by simulations with respect to each position on the pupil plane of the projection lens 10 and the database for the Zernike sensitivity.

More specifically, the effective light source distribution is set to assure that the amount of positional deviation of the test pattern image, from a predetermined position, mainly depends on a particular Zernike coefficient, and the light passing through the pupil region of the projection optical system is restricted.

More particularly, the effective light source distribution of the illumination system is set to assure that the amount of positional deviation of the test pattern image from the predetermined position and the particular Zernike coefficient are placed in one-to-one relationship, and the light passing through the pupil region of the projection optical system is restricted.

Figure 2:
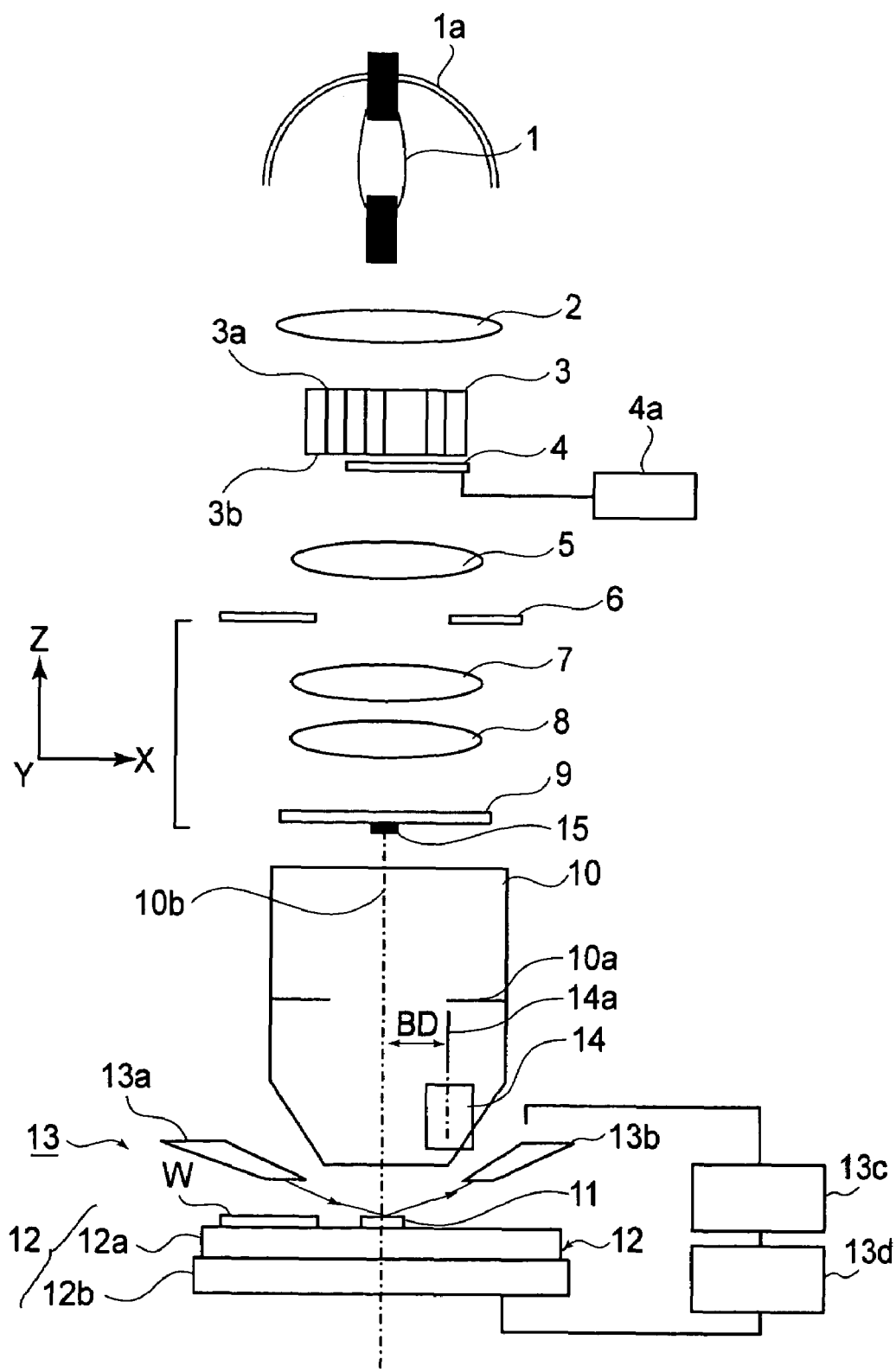
FIG. 2 is a schematic view of a projection exposure apparatus.

FIG. 2 is a schematic view of a projection exposure apparatus used in this embodiment. The illustration made in FIG. 1 corresponds to a perspective view of a portion of FIG. 2.

In FIG. 2, denoted at 1 is a light source that produces exposure light. It may comprise a high-pressure Hg lamp or an excimer laser, for example. Where a high-pressure Hg lamp is used as in the illustrated example, exposure light emitted from the light source 1 is collected by an elliptical mirror 1a toward a predetermined light convergence point. The light convergence point is then imaged upon a light entrance surface 3a of a fly's eye lens 3 by means of an input lens 2. The fly's eye lens 3 has a rear (reticle side) focal-point plane 3b where a large number of secondary light sources (effective light sources) are produced. Exposure light emitted from these secondary light sources advances by way of aperture stop 4, first relay lens 5, projection type reticle blind 6, second relay lens 7, and main condenser lens 8, and it illuminates a reticle 9 in the manner is called "Koehler illumination" with uniform illuminance. The pattern of the reticle 9 being illuminated by the exposure light is projected by a projection optical system 10 onto a photosensitive substrate (wafer) W.

A wafer stage 12 comprises an X-Y stage 12a for positioning a detecting system 11 with respect to any arbitrary positions along a plane perpendicular to the optical axis 10b of the projection optical system 10, and a Z stage 12b for setting the position (focus position) of the photosensitive substrate W in a direction parallel to the optical axis 10b of the projection optical system 10.

There is an autofocus system 13 for detecting the focus position of the photosensitive substrate W. The autofocus system 13 comprises a light sending system 13a for projecting an image of a slit-like detection pattern, for example, onto the surface of a plate 11 having the same level (height) as the photosensitive substrate W surface, obliquely with respect to the optical axis 10b of the projection optical system 10. The autofocus system further comprises a light receiving system 13b for receiving reflection light from the surface of the plate 11 and for re-imaging an image of the detection pattern. If the position of the plate 11 surface changes, it causes a change in the position of the image of the detection pattern being re-imaged by the light receiving system 13b. Thus, by detecting the image position, any changes of the focus position can be detected. The light receiving system 13b includes a photoelectric detector 13c which is arranged to produce a signal being variable with the position of the re-imaged detection pattern. A control system 13d drives the Z stage 12b of the wafer stage 12 so as to maintain that signal at a predetermined level, by which the position of the photosensitive substrate W surface can be held at a predetermined position (imaging plane of the projection optical system 10).

Figure 4:
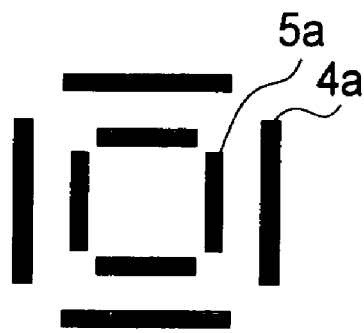
FIGS. 4, 5 and 6 each shows an example of test pattern.
Figure 5:
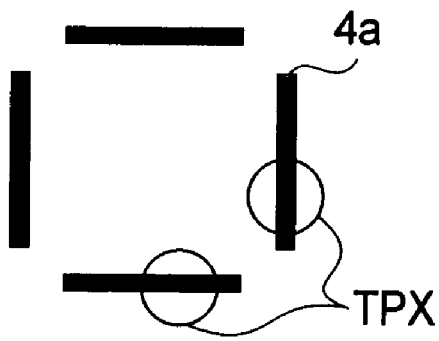
Figure 6:
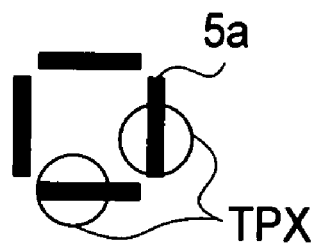

FIGS. 3A and 3B each illustrate a portion of a test pattern usable in this embodiment. FIGS. 5 and 6 each illustrate a single unit of test pattern to be used. The test pattern is illuminated with illumination light defined by means of the aperture stop 4, and an image of the test pattern is imaged upon the photosensitive substrate W through the projection optical system 10. In FIG. 5, each of portions TPX of the grid is provided by the pattern shape shown in FIG. 3A or 3B. Furthermore, on the reticle bottom surface which is placed above the test pattern of FIG. 5, there is a light blocking pattern AP formed of chromium film. On the other hand, at the reticle bottom surface which is placed above the test pattern of FIG. 6, there is no light blocking pattern formed. Thus, the effective light source that illuminates the test pattern of FIG. 6 is not restricted by the reticle bottom surface. Dual exposure is then carried out so that the test pattern of FIG. 5 and the test pattern of FIG. 6 are imaged to be superposed one upon another on the photosensitive substrate W such as shown in FIG. 4. Then, any positional deviation of FIG. 5 is measured while taking the pattern of FIG. 6 as a reference.

Next, the procedure for measuring Zernike coefficients C5 and C6 (astigmatism) will be described in detail.

Figure 7:
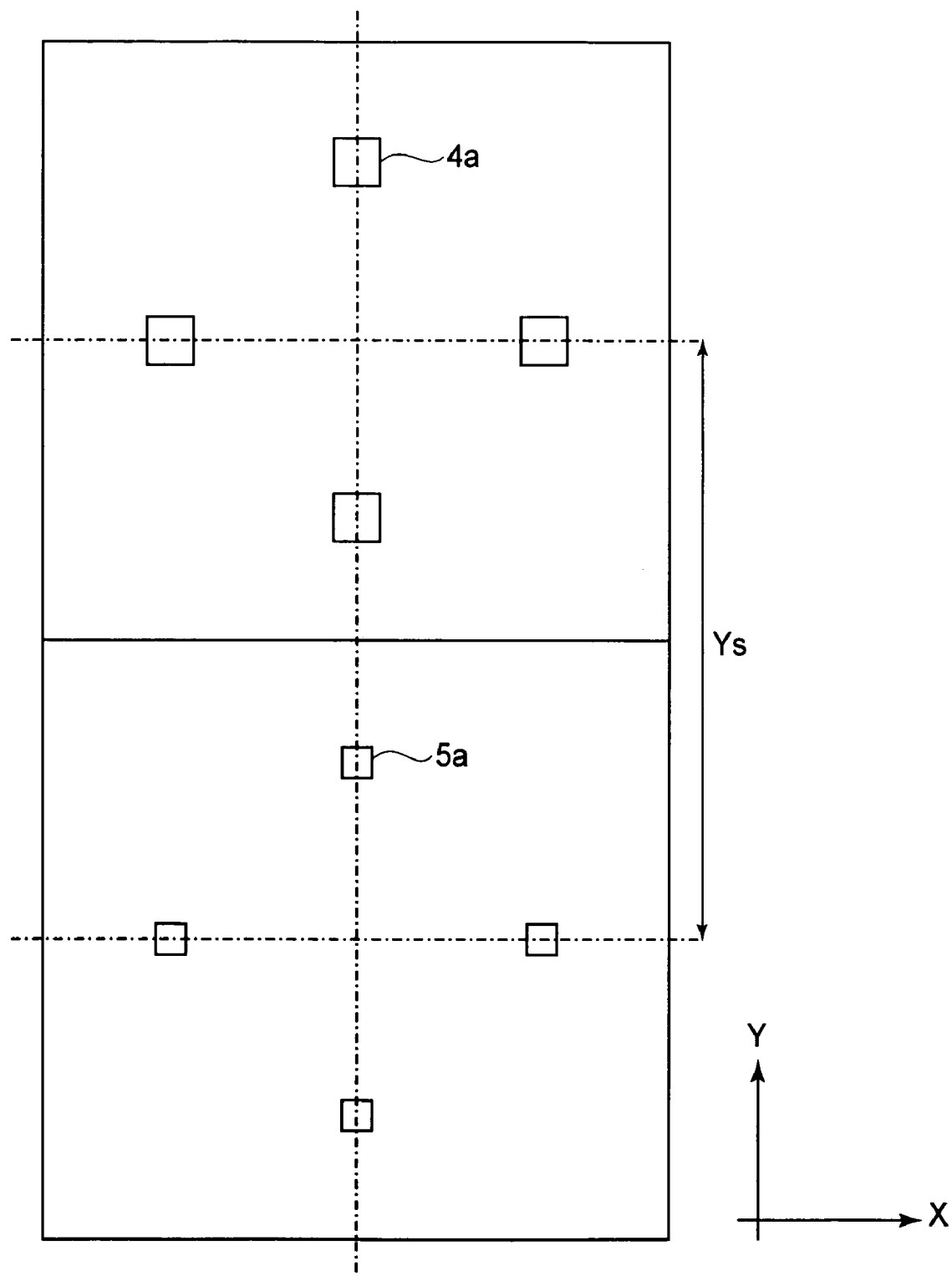
FIG. 7 is a schematic view for explaining disposition of test patterns on a reticle pattern-bearing surface, to be used for measurement of Zernike coefficient C5.
Figure 8:
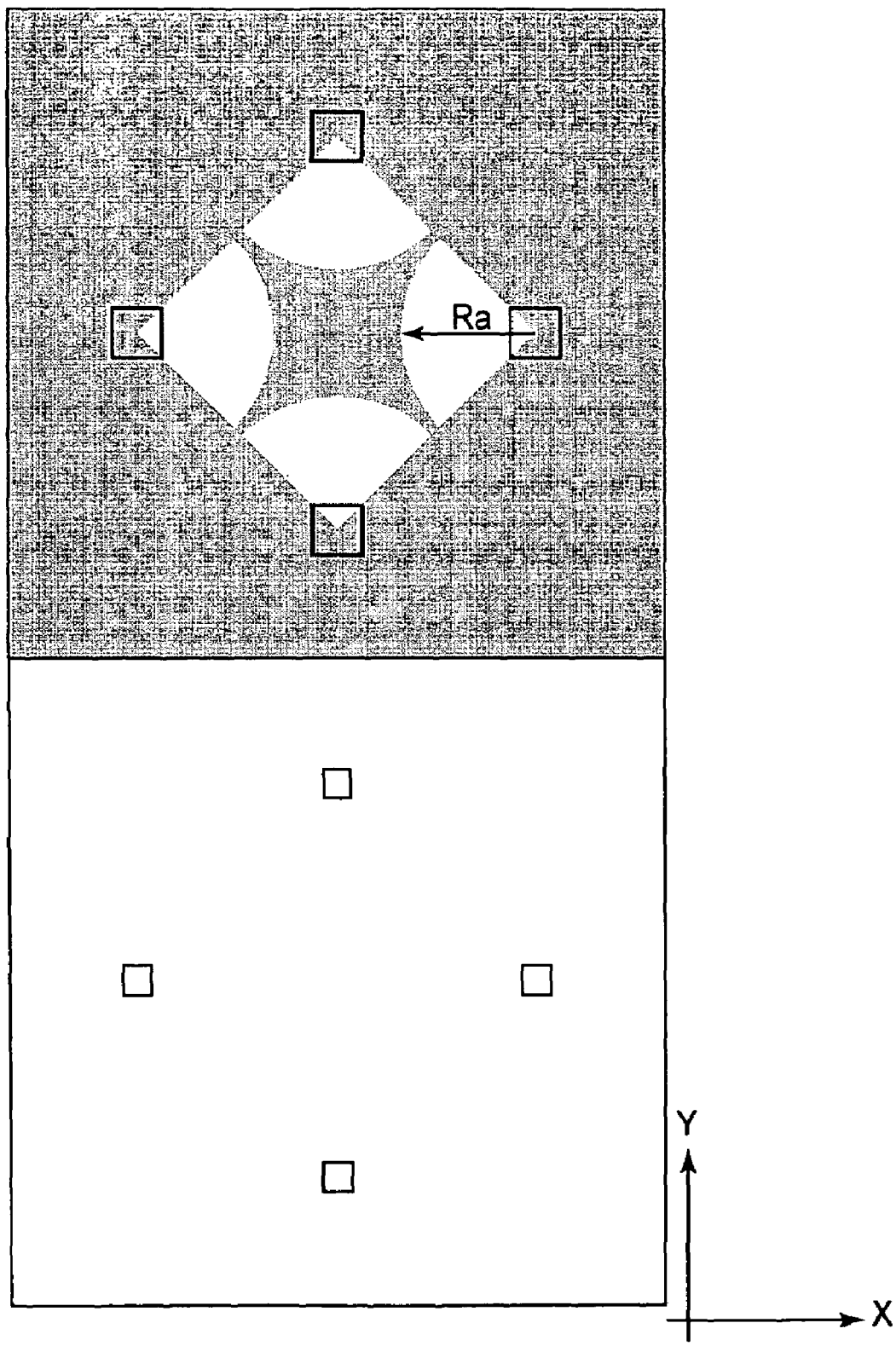
FIG. 8 is a schematic view for explaining disposition of a light blocking pattern on a reticle rear surface, to be used for measurement of Zernike coefficient C5.

FIGS. 7 and 8 are schematic views for explaining a test pattern unit to be used for measurement of Zernike coefficient C5. FIG. 7 shows disposition of test patterns being distributed on a pattern bearing surface Cr of the reticle. The unit comprises two portions. In the upper half region, there are four test patterns 4a (each being such as shown in FIG. 5) which are arrayed in cross shape. In the lower half region, there are test patterns 5a (each being such as shown in FIG. 6) which are arrayed similarly in cross shape. The central position of the four test patterns 4a and the central position of the four test patterns 5a are disposed with a spacing Ys. After exposure of the patterns 4a, the wafer stage 12 is moved by Ys and then the patterns 5a are transferred (dual exposure). The patterns 4a and 5a are thus combined as a single unit, and actually there are many units of these patterns formed on the reticle, each unit being able to be exposed as superposedly such as shown in FIG. 4.

FIG. 8 illustrates disposition of the light blocking pattern AP which is formed by Cr film and provided at the rear side (reticle bottom surface) of the pattern surface where the test patterns of FIG. 7 are formed. In the FIG. 8 example, four fan-shaped (quarter circle) patterns are disposed in cross shape, with the vertexes of the fan-shaped patterns being placed coincident with the centers of the test patterns 4a of FIG. 7. The radius Ra of the light blocking pattern is made larger than a value Rna obtainable by converting the numerical aperture NA of the projection optical system 10 into a radius on the reticle surface. The lower half region shown in FIG. 8 has its Cr film removed, such that the effective light source of illumination light incident on the test patterns 5a of FIG. 7 can illuminate the test patterns 5a without being restricted at all by the reticle bottom surface.

Figure 9:
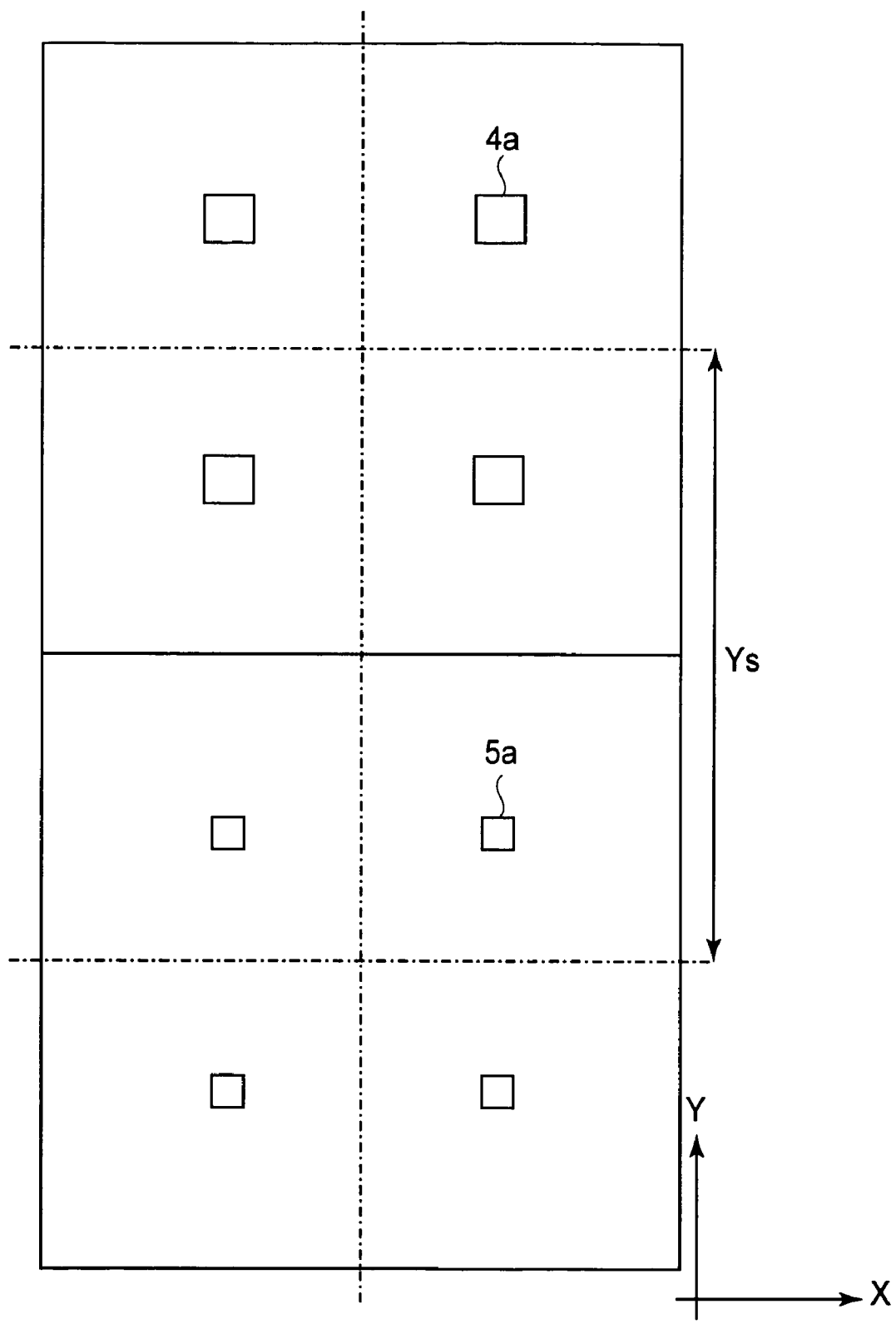
FIG. 9 is a schematic view for explaining disposition of test patterns on a reticle pattern-bearing surface, to be used for measurement of Zernike coefficient C6.
Figure 10:
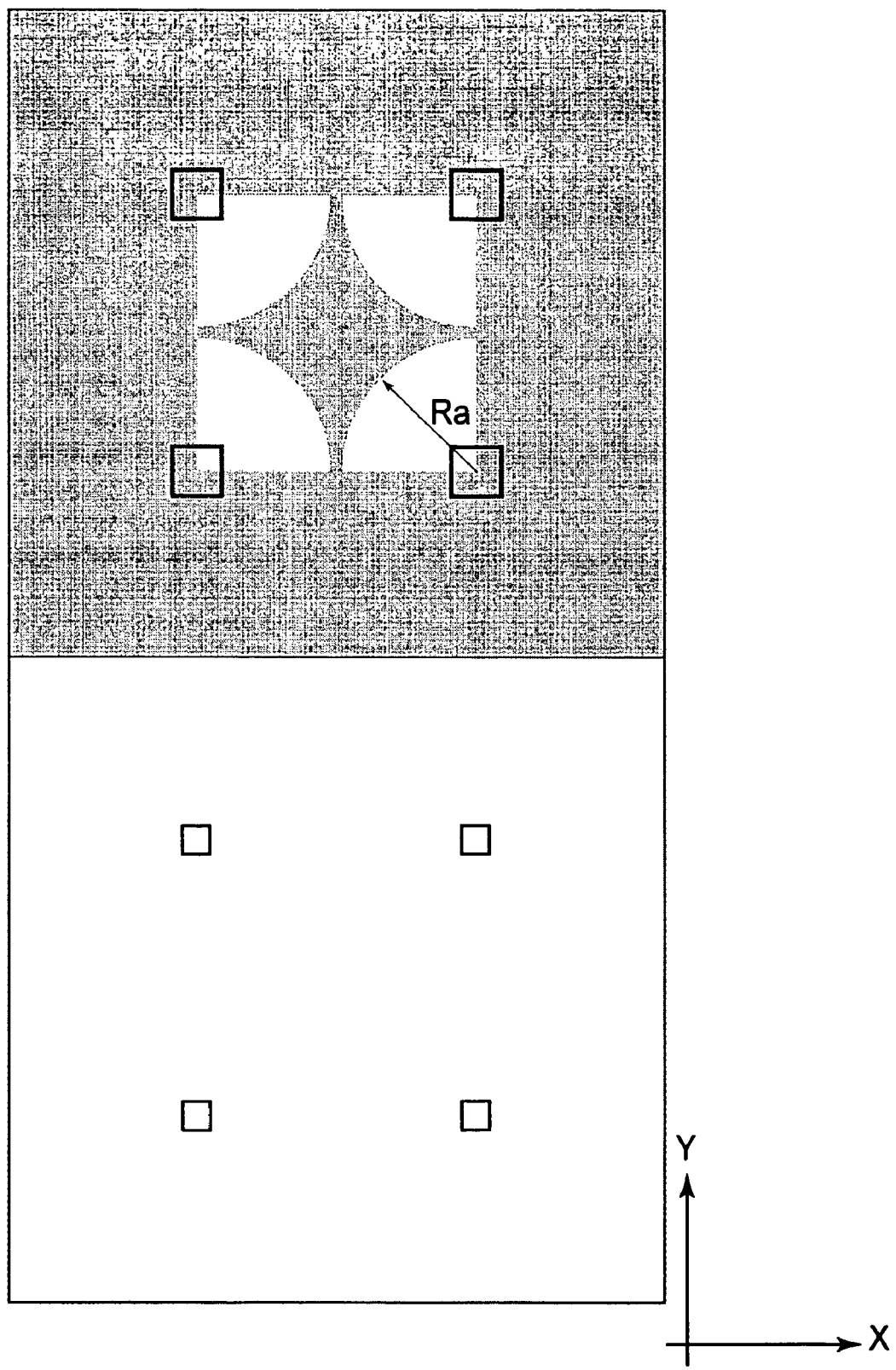
FIG. 10 is a schematic view for explaining disposition of a light blocking pattern on a reticle rear surface, to be used for measurement of Zernike coefficient C6.

FIGS. 9 and 10 are schematic views for explaining a test pattern unit to be used for measurement of Zernike coefficient C6.

The test patterns 4a and 5a of FIG. 9 are placed at positions defined by rotating the pattern disposition of FIG. 7 by 45 degrees. Similarly, the light blocking patterns of FIG. 10 are placed at positions defined by rotating the pattern disposition of FIG. 8 by 45 degrees. The lower half region shown in FIG. 10 has its Cr film removed, similarly to the example of FIG. 8.

Figure 11:
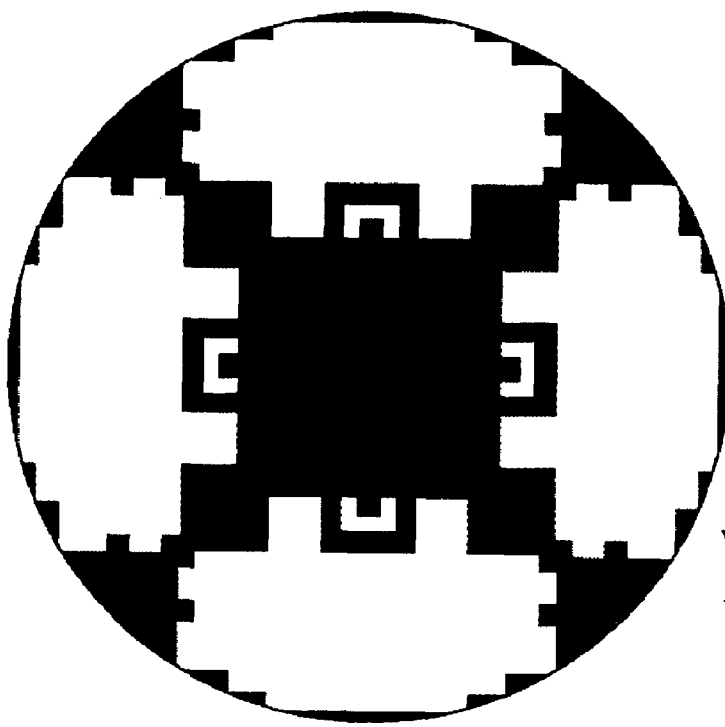
FIG. 11 shows an aperture stop to be used for measurement of Zernike coefficient C5.
Figure 11:
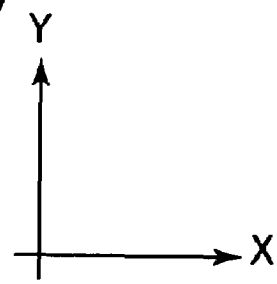
Figure 12:
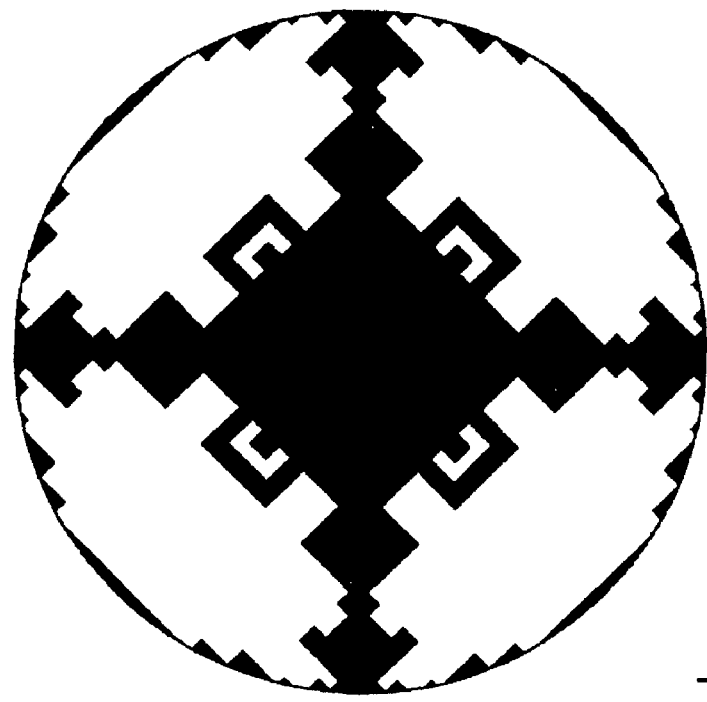
FIG. 12 shows an aperture stop to be used for measurement of Zernike coefficient C6.
Figure 12:
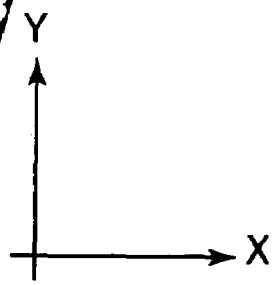

FIGS. 11 and 12 illustrate examples of aperture stop 4. The example shown in FIG. 11 is an aperture stop for use in the measurement of Zernike coefficient C5, while the example shown in FIG. 12 is an aperture stop for use in the measurement of Zernike coefficient C6.

Next, the procedure of dual exposure will be explained. First, the aperture shape of the aperture stop 4 to be used is chosen in accordance with the Zernike coefficient to be obtained. Namely, where Zernike coefficient C5 is going to be measured, the aperture stop of FIG. 11 is selected. If Zernike coefficient C6 is to be measured, the aperture stop of FIG. 12 is chosen. The marks 4a and 5a are then illuminated with illumination light having an effective light source shape that is defined by the combination of the selected aperture stop 4 and the light blocking pattern AP provided on the bottom surface of the reticle. Subsequently, the wafer stage 12 is moved by Ys so that the marks 4a and 5a overlap with each other, and the marks 4a and 5a are exposed (transferred). The wafer sample thus exposed is developed and, after a resist pattern is formed, any positional deviations of the patterns 4a with respect to the patterns 5a are measured by using an overlay measuring machine. From the results of positional deviation measurements, the amount of aberration can be calculated. Where the aberration to be obtained is C5, the four test patterns shown in FIG. 7 are measured by using the overlay measuring machine. If it is C6, the four test patterns shown in FIG. 9 are measured by using the overlay measuring machine.

Next, the procedure of detecting the amount of aberration on the basis of positional deviations of the test patterns, where Zernike coefficient C5 is to be measured, will be explained in detail.

Figure 13:
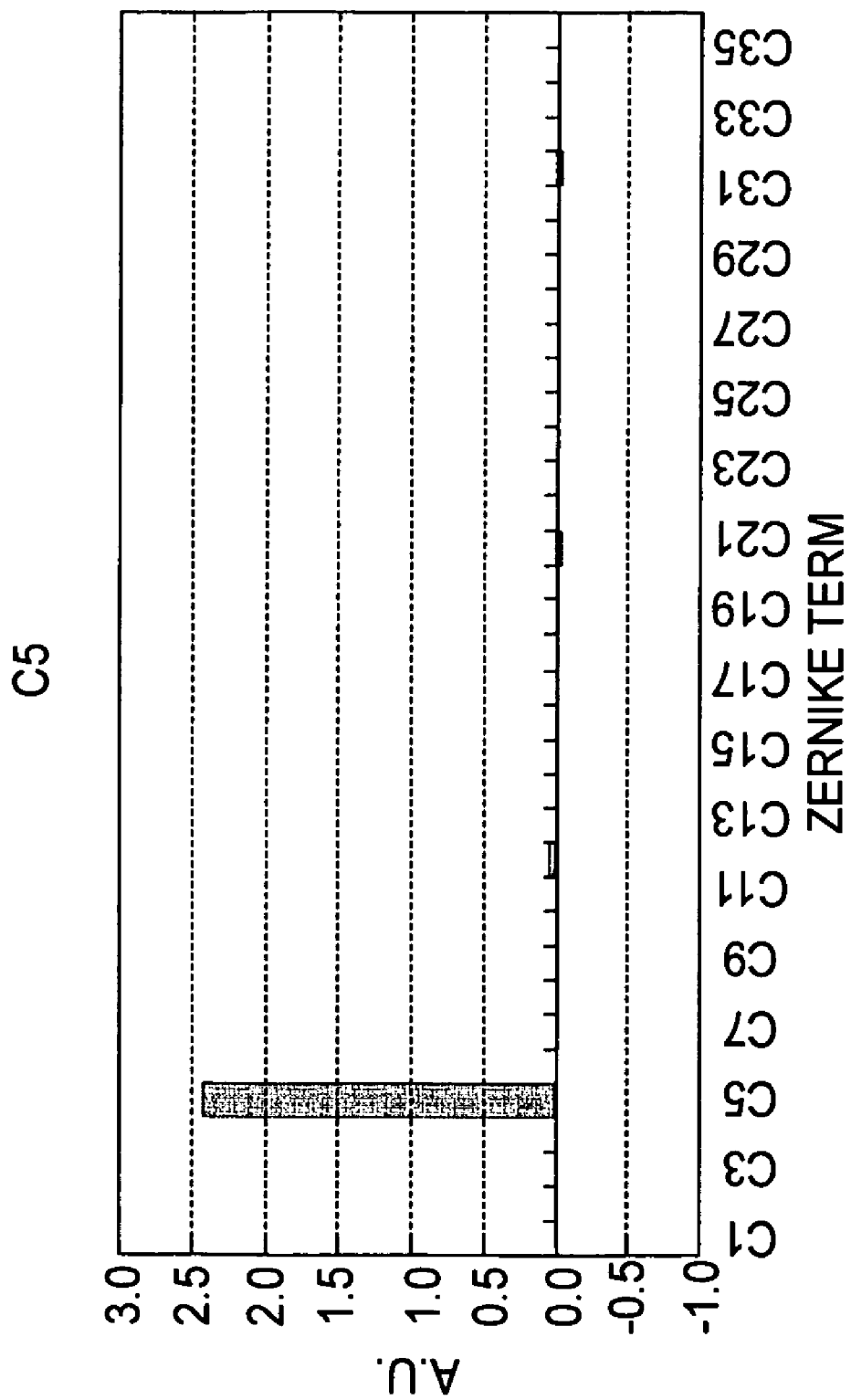
FIG. 13 is a graph for explaining optimization where the stop of FIG. 11 is used.

Of the test patterns shown in FIG. 7, the positional deviation of the right-hand side test mark is denoted by d1 and, similarly, the positional deviation of the left-hand side test mark is denoted by d2. The difference between them is denoted by S(d1−d2). Here, two quantities are measured as the positional deviation amount. One is a V-shaped pattern (deviation in X direction), and the other is an H-shaped pattern (deviation in Y direction) being orthogonal to the former. These deviations can be expressed by SV(d1−d2) and SH(d1−d2), respectively. Subsequently, in a similar manner, a positional deviation d3 of the upper test pattern and a positional deviation d4 of the lower test pattern are obtained. From these two positional deviation amounts, SV(d3−d4) and SH(d3−d4) are obtainable. From these positional deviation measurement results, C5 can be calculated in accordance with the following equation.

$$C5=\{SV(d1-d2)-SH(d3-d4)\}/Zer5 \qquad (5)$$

where Zer5 is the sensitivity coefficient of the test pattern positional deviation amount with respect to the produced amount of C5, that can be obtained beforehand by simulation or experiments, for example. FIG. 13 illustrates the results of calculation for the sensitivity coefficient, obtained on the basis of optical simulation calculation. It is seen from FIG. 13 that the positional deviation amount of the test pattern has large sensitivity only to C5 of the Zernike coefficients, and therefore that the term C5 can be measured with good precision in accordance with the measuring method of this embodiment.

Figure 14:
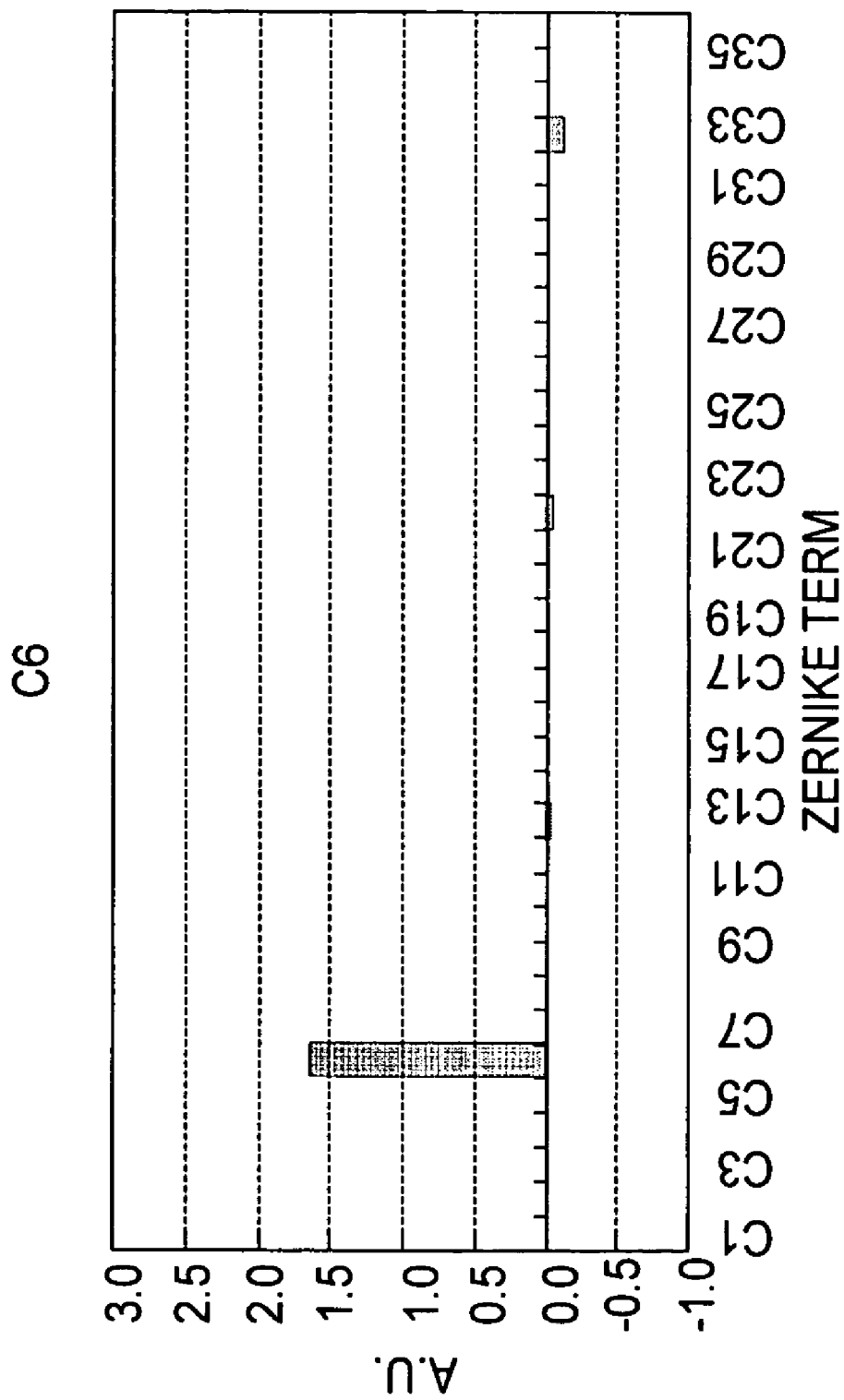
FIG. 14 is a graph for explaining optimization where the stop of FIG. 12 is used.

Similarly, where the aperture stop of FIG. 12 and the test patterns of FIG. 9 are used, if the positional deviations of the upper right, lower left, upper left and lower right test patterns denoted by d1', d2', d3' and d4', respectively, C6 can be determined in accordance with the following equation.

$$C6=\{SV(d1'-d2')+SH(d1'-d2')+SV(d3'-d4')-SH(d3'-d4')\}/Zer6 \qquad (6)$$

wherein Zer6 is a sensitivity coefficient, to C6, of the test pattern positional deviation amounts, similarly to the aforementioned example. FIG. 14 illustrates the results of calculation for Zer6, obtained on the basis of optical simulation calculation similar to the aforementioned example.

Figure 15A:
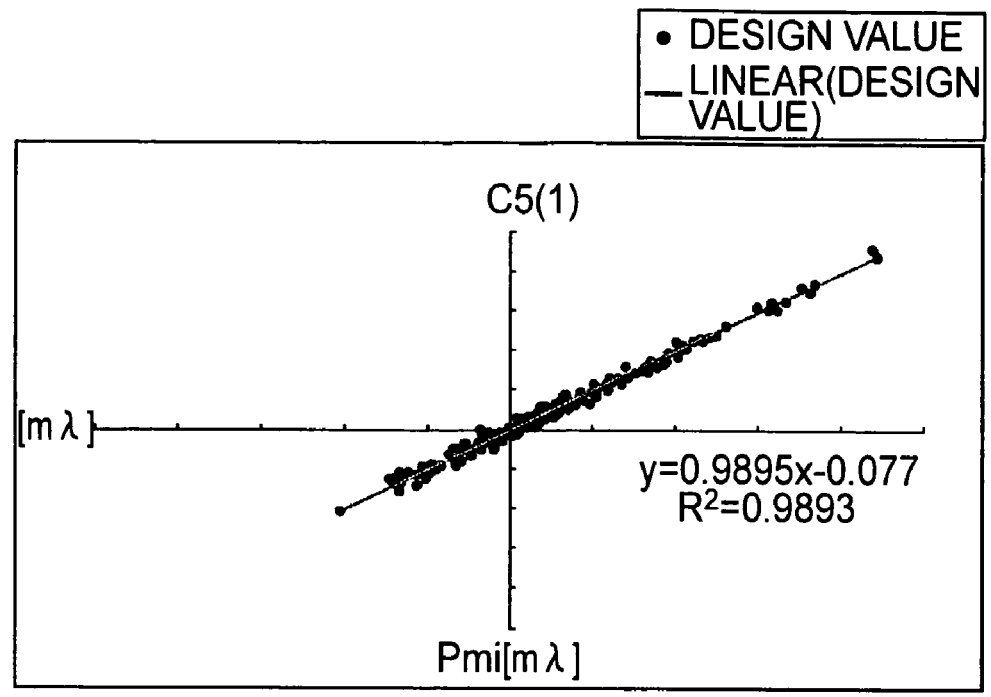
FIG. 15A is a graph for explaining the results of evaluation where the stop of FIG. 11 is used.
Figure 15B:
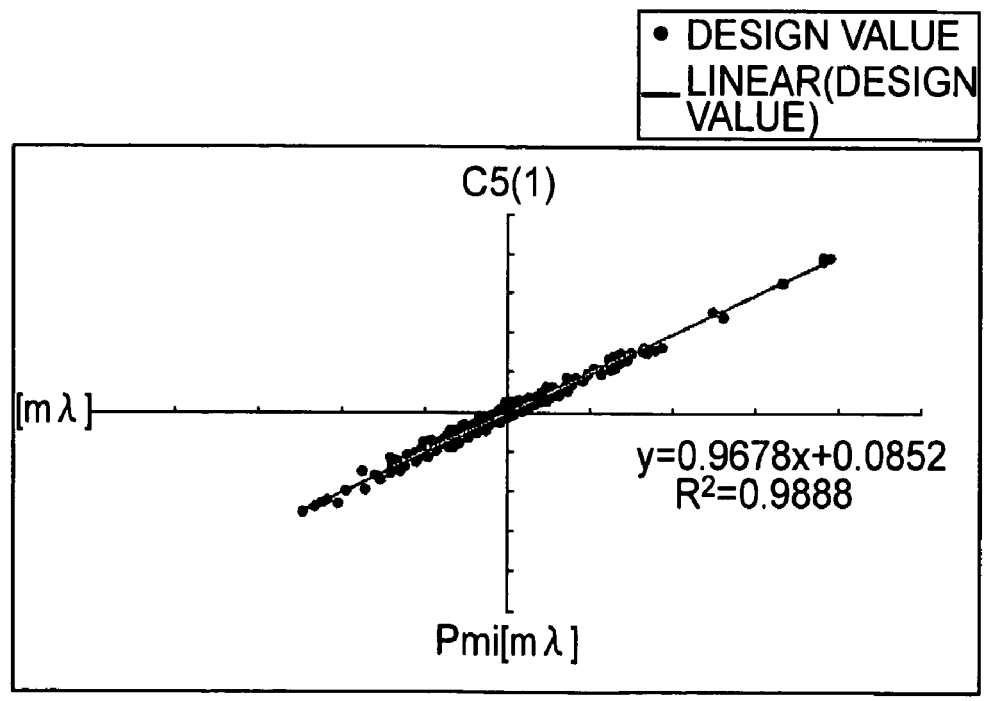
FIG. 15B is a graph for explaining the results of evaluation where the stop of FIG. 12 is used.

FIGS. 15A and 15B illustrate the results of investigation made to the correlation between the results of measurement made to the projection lens in accordance with the present embodiment and the results of Zernike coefficient as measured by using PMI (phase measuring interferometer). It is seen from these drawings that the measurement method of this embodiment provides sufficient measurement precision for detection of Zernike coefficients (lens aberration).

In the present embodiment, in regard to the openings of the aperture stop 4, the optimization is carried out on the basis of choosing one of "passing light" and "intercepting light". However, a light attenuating material may be used to change the density, and higher precision optimization is attainable in that occasion. Furthermore, optimization may be done while setting further higher orders and, in that occasion, measurement of even higher order aberration is enabled.

As an alternative, a DMD (Digital Mirror Device) available from Texas Instruments Co. may be used to change the effective light source into a desired shape. Where such variable setting device is incorporated into an exposure apparatus, an optimum effective light source shape can be produced without preparing an aperture stop 4 of special shape.

The optimization of the effective light source shape may be done by use of a filter which may be provided at the pupil plane of the projection lens, in place of using the aperture stop 4 inside the illumination optical system.

Furthermore, on the basis of the measured value (projection lens aberration amount) obtained, a correction optical system which may be provided inside a projection lens 10 may be driven or, alternatively, the center wavelength of the oscillation wavelength of an excimer laser used as an exposure light source may be changed. The aberration of the exposure apparatus can be corrected thereby.

In accordance with this embodiment, as described hereinbefore, not only an aperture stop 4 (or a pupil filter) but also a light blocking pattern AP are used as pupil region optimizing means, and measurement of desired aberration is carried out on the basis of it. This removes the necessity of exchanging or rotating the aperture stop 4 many times, and thus a desired Zernike coefficient or coefficients can be calculated by a simplified operation that takes a shortened time.

The test pattern shape used for the measurement may be a box-in-box mark generally used for overlay measurement, or it may be a bar-in-bar mark. In such occasion, aberration measurement can be carried out without using a special measuring machine.

In this embodiment, the light blocking pattern AP is provided on the mask bottom surface and, actually, a plurality of light blocking patterns are used in combination with test patterns provided on the front surface of the mask. This enables aberration measurement without using plural illumination stops or without rotating a stop to perform test pattern exposures repeatedly. Thus, the test sample exposure operation can be done conveniently.

A variable device such as DMD of Texas Instruments Co. may be used in an exposure apparatus to variably set the shape of the effective light source as desired. This enables desired aberration measurement without newly preparing an illumination system stop.

The light blocking pattern at the mask bottom surface may be provided by a pattern effective to intercept a portion of the effective light source without dependence upon the numerical aperture of the projection lens. This enables aberration measurement without the necessity of preparing additional mask in response to a change in the numerical aperture of the projection lens which is the object of measurement. This avoids the inconveniences of increased cost due to preparation of test masks which are very expensive.

Embodiment 2

A second embodiment of the present invention will be described below.

By using the measuring method of the first embodiment, a desired aberration (Zernike term) can be measured with good precision. In actual exposure apparatus applications, however, in many cases, the capability of controlling a particular aberration amount might be sufficient to maintain the performance of the exposure apparatus. For example, although the focal point position changes with a difference in illumination effective light source shape or a difference of pattern, such change can be controlled only by measuring a defocus component and lower-order spherical aberration of a projection lens.

Figure 16:
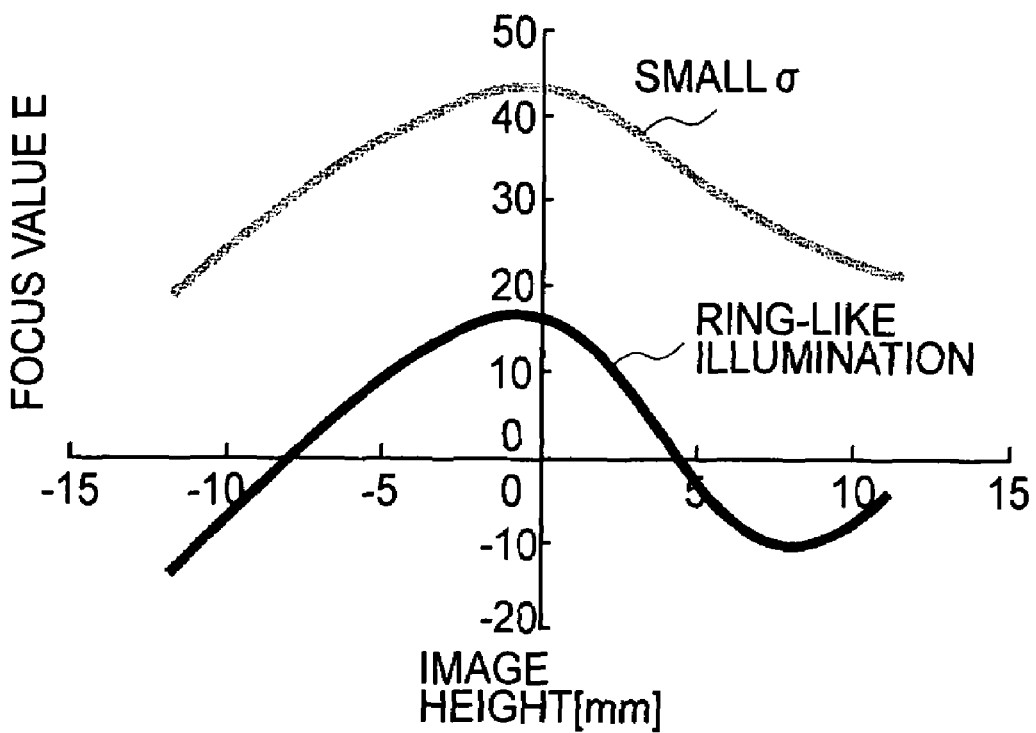
FIG. 16 is a graph for explaining differences in regard to optimum focal point position, depending on the effective light source shape.
Figure 17:
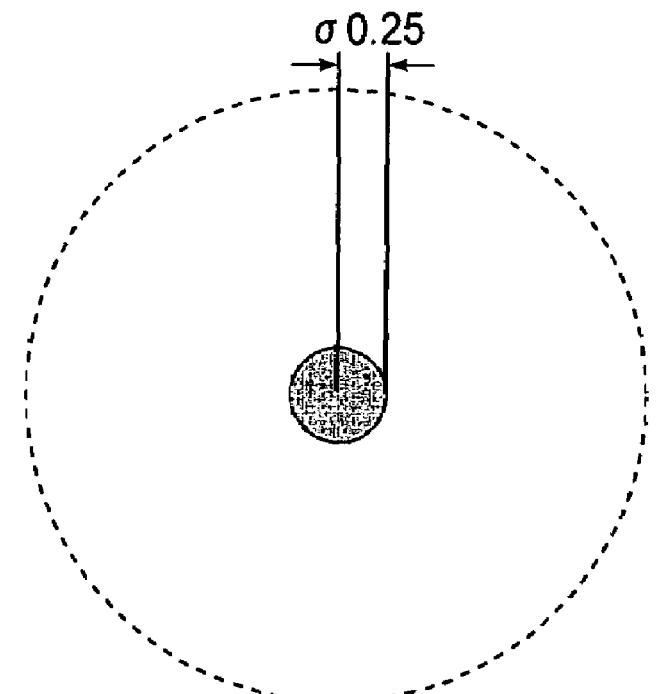
FIG. 17 is a schematic view for explaining the shape of a small-$\sigma$ illumination effective light source in FIG. 16.
Figure 18:
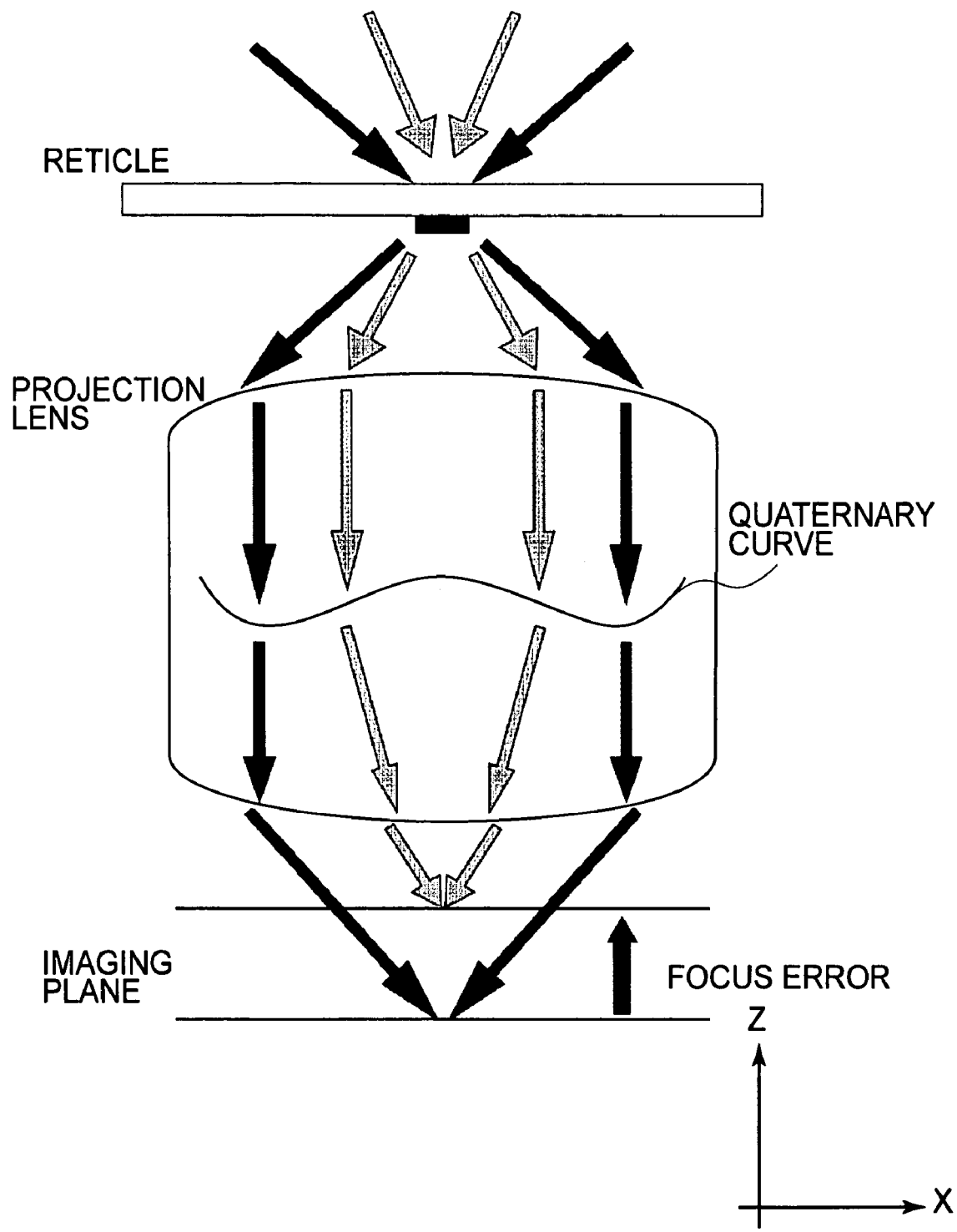
FIG. 18 is a schematic view for explaining the principle of production of differences in the optimum focal point position in FIG. 16.

FIG. 16 is a graph showing an example of differences of focal point position (best focus position) with differences of the effective light source shape. The axis of abscissa of the graph denotes the distance (image height) from the center of the projection lens to each measurement point. The axis of ordinate denotes the best focus position at each measurement point. Upper curve in the graph depicts changes (field curvature shape) of the focal point position, with measurement image heights, under a condition of using an effective light source shape such as shown in FIG. 17 and small-σ illumination (σ is 0.25). Lower curve in the graph depicts the field curvature shape under a condition of using ring-like illumination of FIG. 25A (outside σ is 0.85 and inside σ is 0.57). It is seen in the graph of FIG. 16 that, the difference in the effective light source shape causes a difference in the best focus value and the field curvature shape. This difference attributes to the remaininig spherical aberration of the projection lens. FIG. 18 schematically illustrates the difference of best focus value caused by the spherical aberration. In FIG. 18, black arrows and gray arrows the light paths, in the ring-like illumination and the small-σ illumination, respectively, from the incidence of illumination light upon a reticle pattern up to the image formation upon a wafer surface by a projection lens. A quaternary curve illustrated inside the projection lens in FIG. 18 depicts the wavefront shape of Zernike coefficient C9, depicted in terms of lower-order spherical aberration and Zernike, and it means that the projection lens of FIG. 18 has remaining spherical aberration.

Figure 25A:
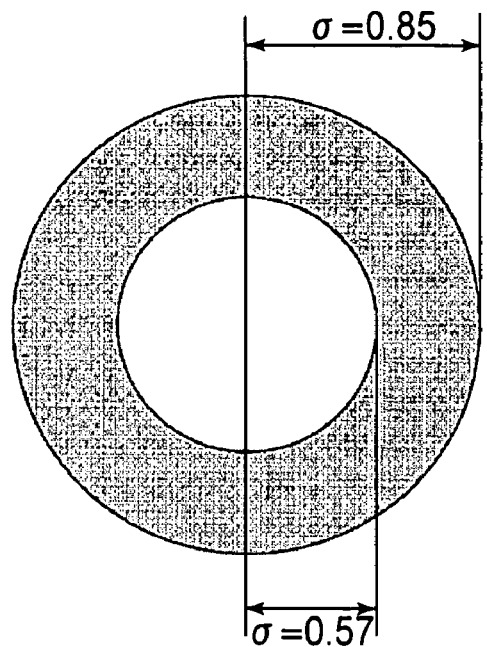
FIGS. 25A and 25B are schematic views, respectively, each for explaining the shape of an effective light source in ring-like illumination.

In the case of ring-like illumination of FIG. 25A, the illumination light to the pattern on the reticle is only the light rays depicted by black arrows in FIG. 18, having a large angle with respect to the direction of a normal to the reticle surface. On the other hand, in the case of small-σ illumination shown in FIG. 17, the illumination light is the light rays depicted by gray arrows in FIG. 18, having a small angle with respect to the normal direction to the reticle surface.

The light rays (black arrows) of ring-like illumination pass the positions on the pupil plane of the projection lens, remote from the center of the lens. At theses positions on the pupil plane, the change in wavefront shape due to spherical aberration is small. Thus, the produced image is hardly influenced by the spherical aberration. On the other hand, the light rays (gray arrows) of the small-σ illumination pass positions near the center of the projection lens pupil plane. At these positions, the change in wavefront shape due to the spherical aberration is large. Hence, as shown in FIG. 18, the imaging light rays are bent by the special aberration, causing a deviation of the focal point position.

Figure 19A:
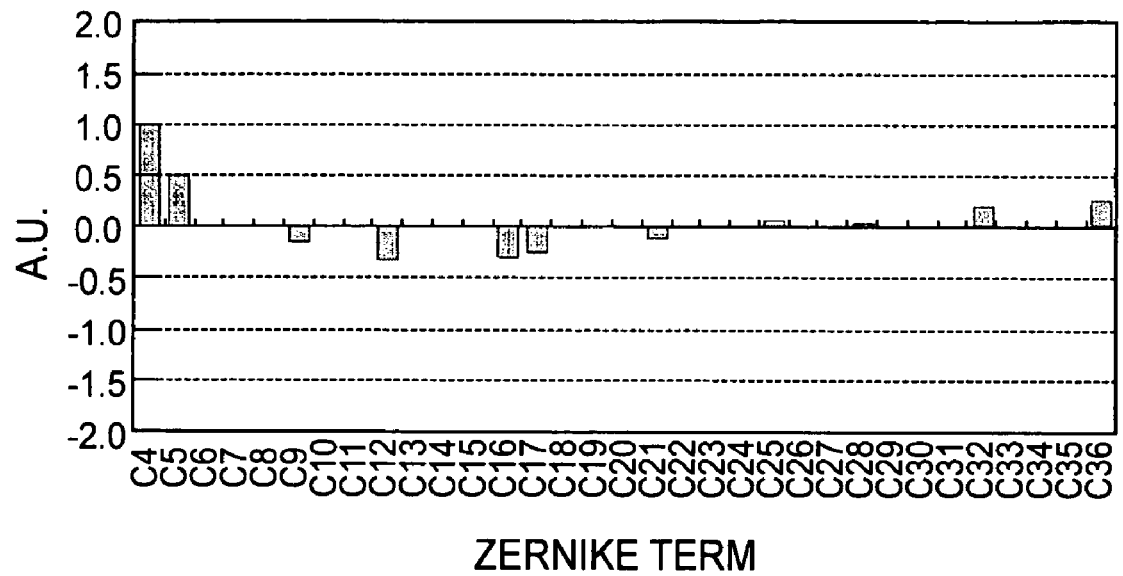
FIGS. 19A and 19B are graphs, respectively, each showing an example of result of calculation for the Zernike sensitivity of the optimum focal point position change with the effective light source shape.
Figure 19B:
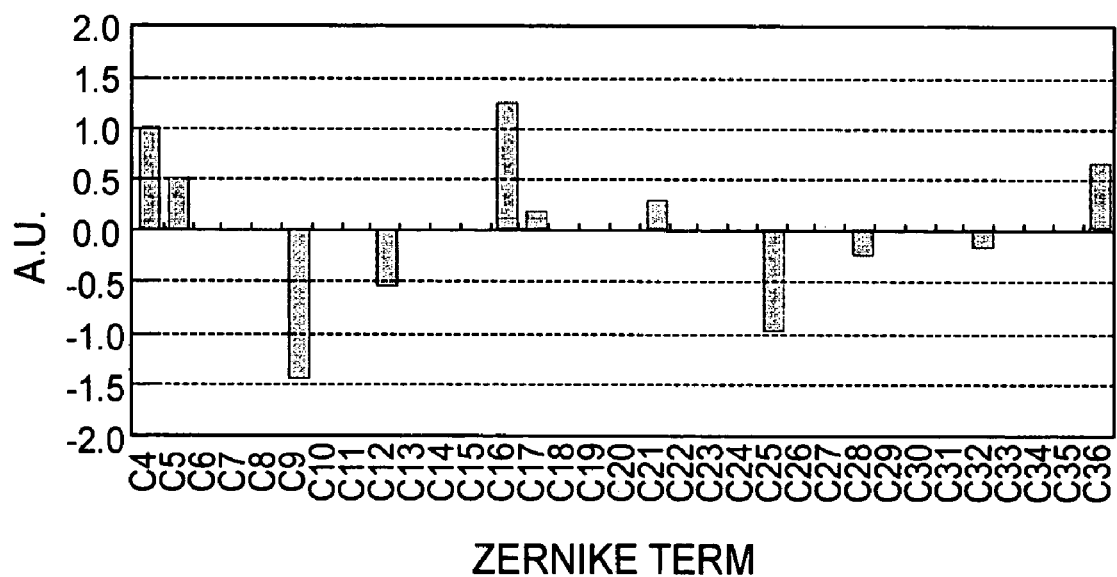
Figure 20:
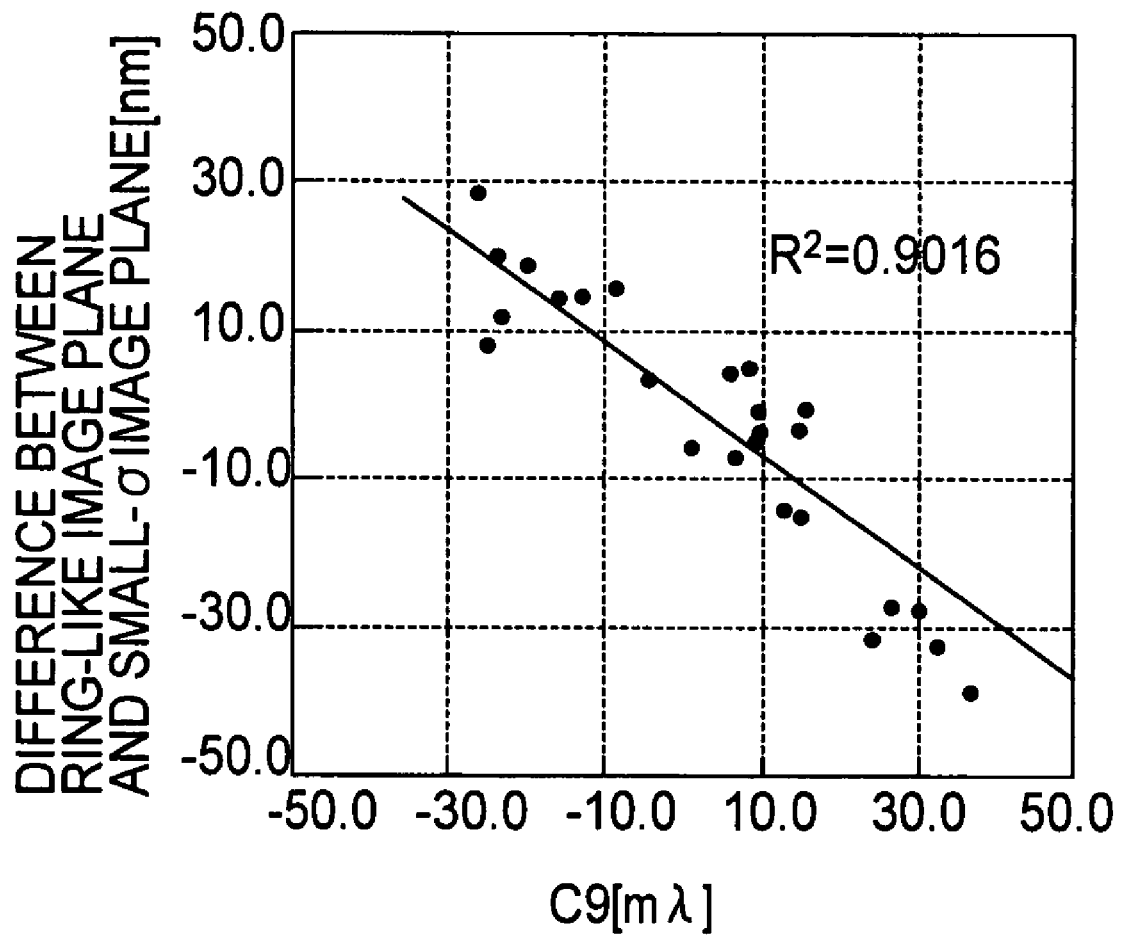
FIG. 20 is a graph for explaining the correlation between lower-order spherical aberration and the optimum focal point position

As described, in the ring-like illumination the focal point position is not largely influenced by the spherical aberration, whereas in the small-σ illumination a deviation of the focal point position is produced due to the influence of the spherical aberration. Optical simulation calculations were carried out to confirm this, and FIGS. 19A and 19B show the results. FIGS. 19A and 19B illustrate the contribution rates of respective Zernike terms to the focal point position change, wherein each bar represents the contribution rate of associated Zernike term, taking the contribution rate of term C4 (defocus) as 1. FIG. 19A corresponds to the calculation results in the ring-like illumination, and FIG. 19B corresponds to the calculation results in the small-σ illumination. In the case of ring-like illumination, the contribution rate of the spherical aberration (term C9) is small as of $\frac{1}{10}$ of that of C4, whereas in the small-σ illumination the contribution rate of term C9 is enlarged to about 1.5 times that of C4. Thus, the influence of the spherical aberration to the focal point position, schematically explained with reference to FIG. 18, is supported. In FIGS. 19A and 19B, although much-higher order spherical aberrations, that is, terms C16, C25 and C36, show large contribution, generally such higher-order aberration components are suppressed to a sufficiently low level during the manufacture of projection lens and, therefore, in practice they hardly contribute to an actual focus position change. FIG. 20 is a graph showing the results of investigations made to several projection lenses, in regard to the correlation between the term C9 and the difference of focal point position between the ring-like illumination and the small-σ illumination. It is seen from FIG. 20 that the difference of focal point position between the ring-like illumination and the small-σ illumination is caused by term C9.

As described above, due to residual spherical aberration of the projection lens, the focal point position changes in response to a change in the effective light source shape of the illumination system. Thus, the focal point position change in the exposure apparatus can be controlled once the defocus component (C4) and lower-order spherical aberration (C9) are measured. Referring now to FIGS. 21-27, the focus position control in an exposure apparatus according to the present embodiment will be explained below.

Figure 21:
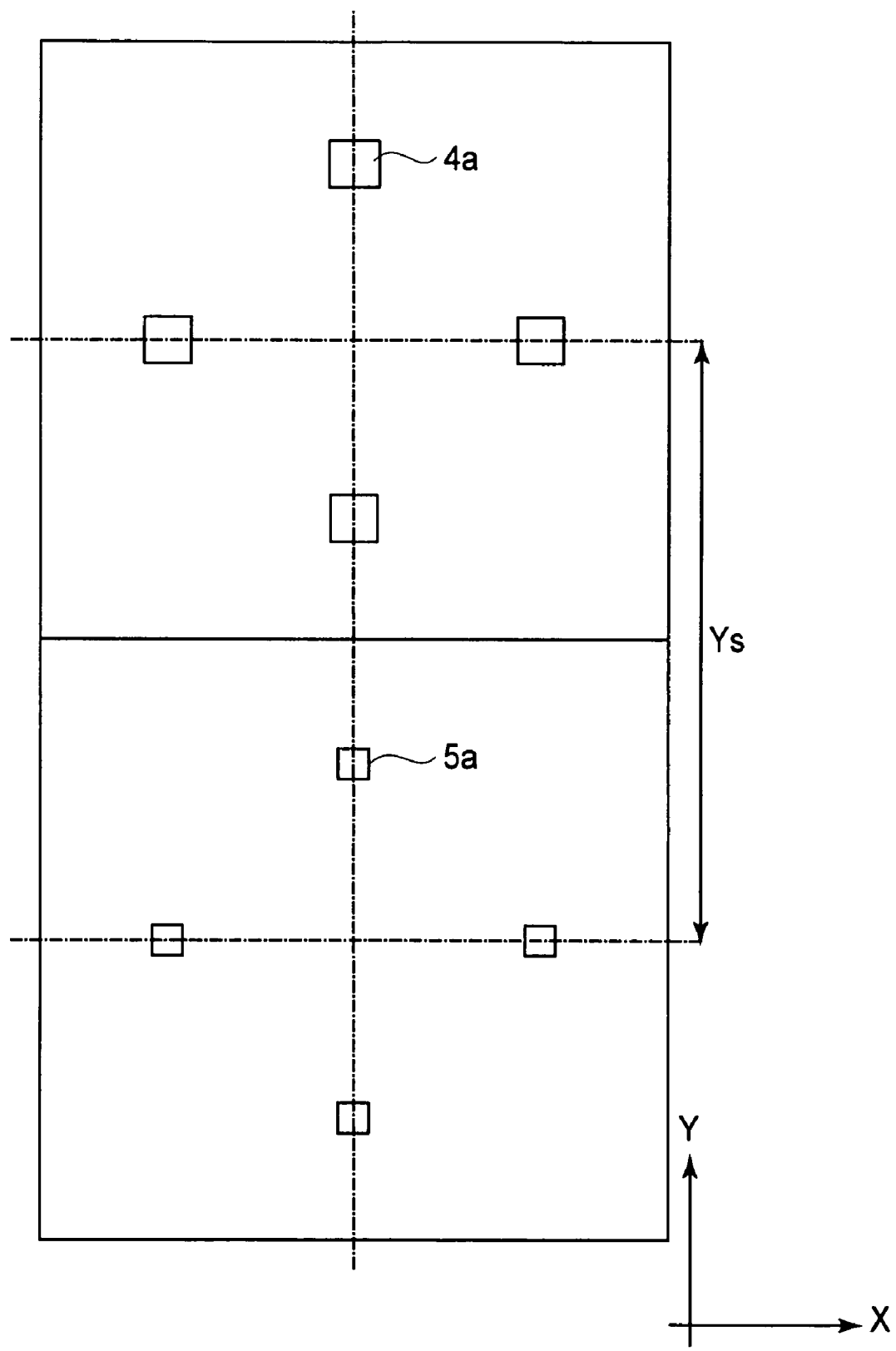
FIG. 21 is a schematic view for explaining the disposition of test patterns on a reticle, in a second embodiment of the present invention.
Figure 22:
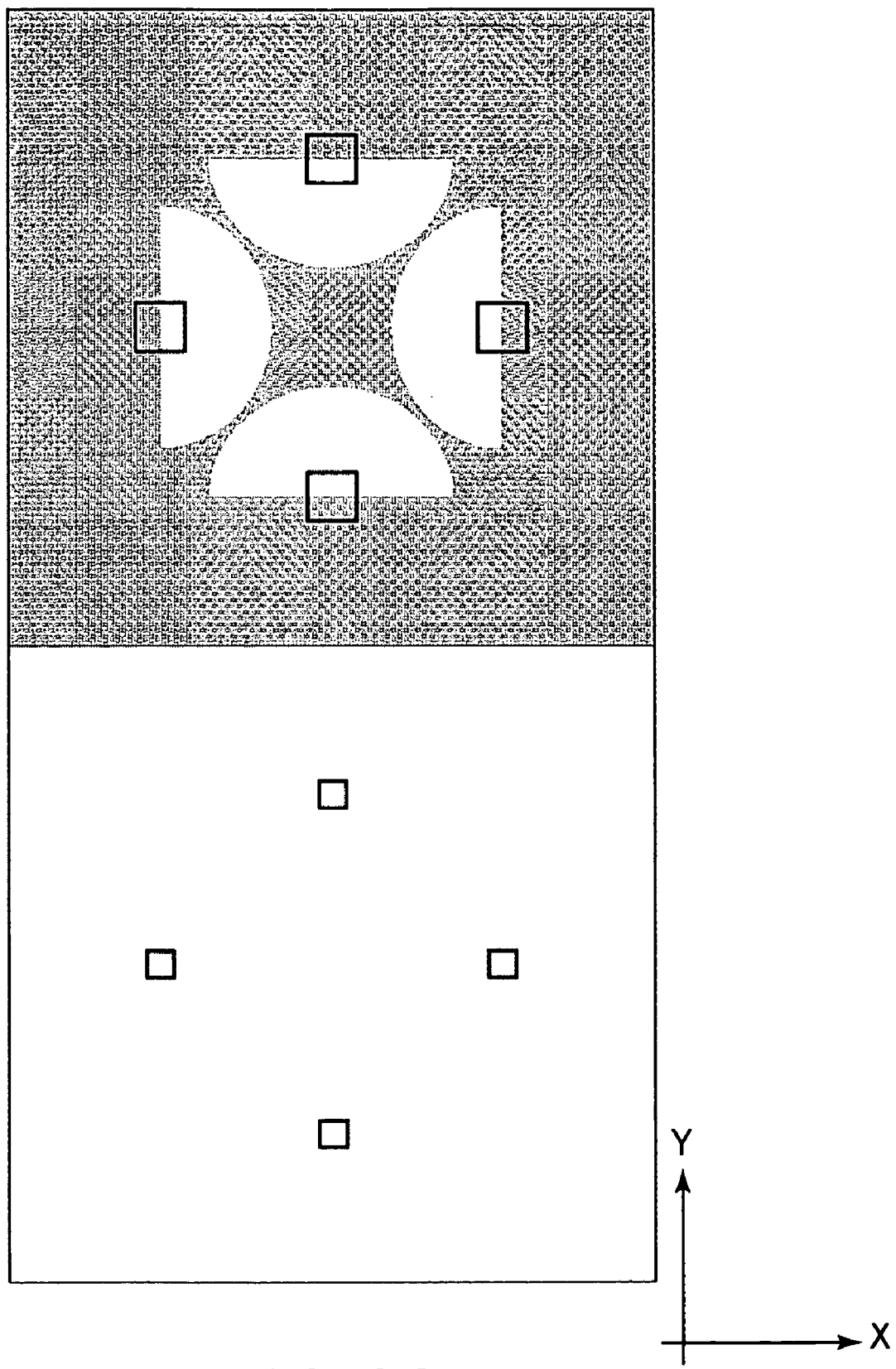
FIG. 22 is a schematic view for explaining the disposition of a light blocking pattern corresponding to the test pattern structure of FIG. 21.

FIGS. 21 and 22 are schematic views, respectively, of test patterns of a reticle 9, to be used in this embodiment. The reticle 9 is similar to that used in the first embodiment, and Cr films are provided on both surfaces thereof. At the bottom surface, there is a light blocking pattern AP for restricting incidence of effective light source of illumination light. At the top surface thereof, there is a test pattern TP for positional deviation measurement (FIGS. 5 and 6) having a pattern structure shown in FIG. 3. FIG. 21 illustrates an example of test pattern TP disposition on the reticle top surface, and FIG. 22 illustrates an example of light blocking pattern AP disposition on the reticle bottom surface. In FIG. 22, each light blocking pattern AP has a semi-circular shape, as compared with the first embodiment. On the other hand, the test pattern TP comprises positional deviation measuring marks 4a (FIG. 5) which are disposed in cross shape, at positions each corresponding to a middle point of "chord" of the semicircular light blocking pattern AP. There are positional deviation marks 5a (FIG. 6) disposed at positions space by Ys from the deviation measuring marks 4a. The Cr film portion on the reticle bottom surface, that corresponds to the positional deviation marks 5a, has been removed such that the effective light source of illumination light for illuminating the positional deviation marks 5a is not at al restricted by the light blocking pattern, like the first embodiment. The pattern structure of the reticle such as described above is similar to one for accomplishing a focus monitoring system as disclosed in Japanese Laid-Open Patent Application, Publication No. 2002-289494 (Published U.S. patent application, Publication No. 2002/015158A1) filed by or assigned to the same assignee of the subject application.

Figure 23:
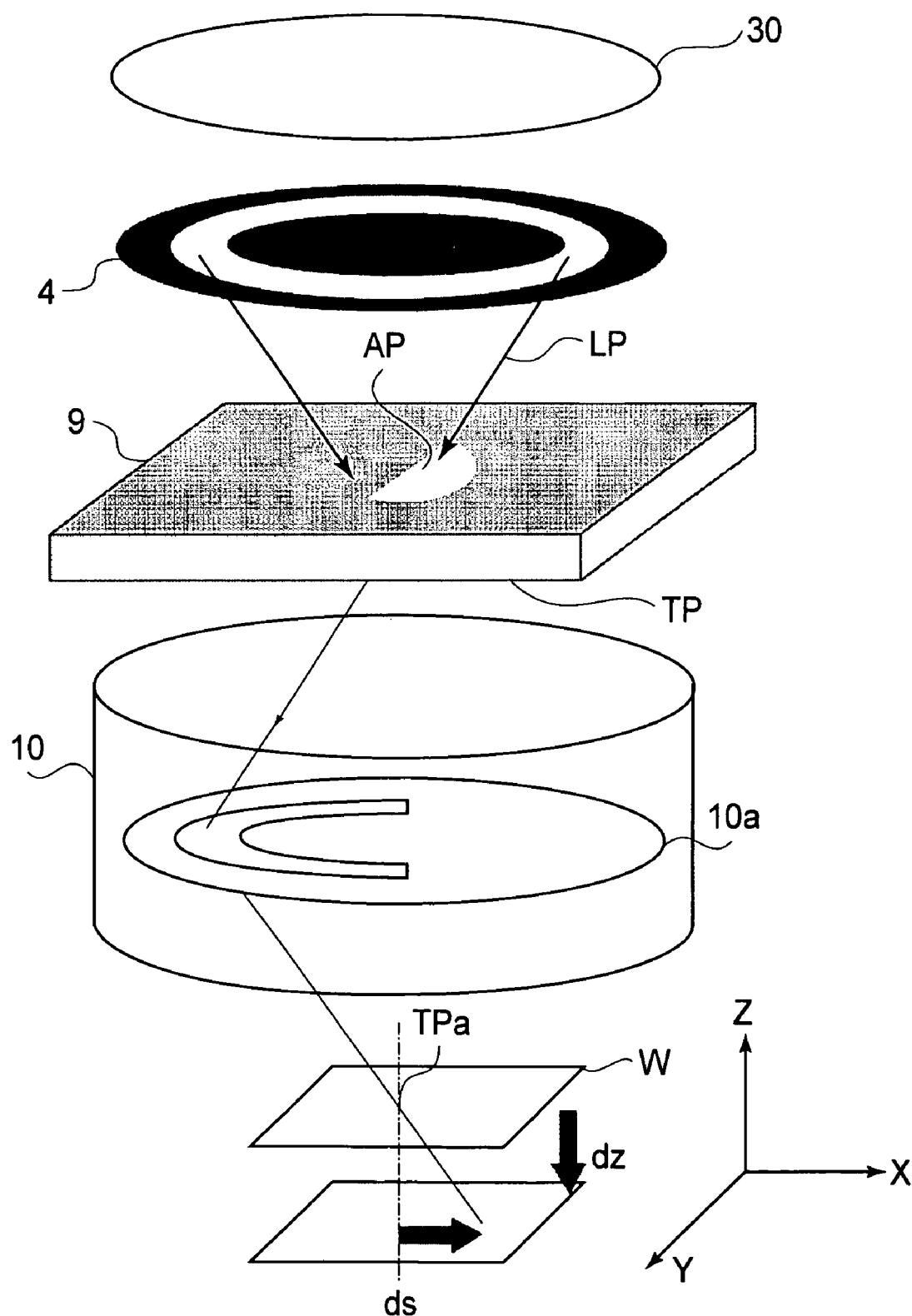
FIG. 23 is a schematic view of a main portion of a projection exposure apparatus.

FIG. 23 schematically illustrates the operational principle of such focus monitoring system. Like numerals as of the first embodiments are assigned to corresponding components. In FIG. 23, an aperture stop (shaping means) 4 has a ring-like shape. For simplicity of explanation, an aperture stop is used in this example. In recent exposure apparatuses, however, in order to avoid loss of illumination light quantity by a stop, some optical components can be used in combination to produce an effective light source of ring-like shape. For example, an axicon or a zoom optical system is usable (U.S. Pat. No. 6,295,122, for further details), and by using this function, the effective light source shape shown in FIG. 23 may be accomplished. On the reticle 9, there are test pattern and light blocking pattern as shown in FIGS. 21 and 22. In FIG. 23, only one semicircular pattern of the light blocking pattern is illustrated. The effective light source of ring-like shape defined by the aperture stop 4 is intercepted by a semicircular light blocking pattern AP on the reticle 9, such that upon the pupil plane 10a of the projection lens 10, only a half region of the ring functions as an effective light source. Only a half can function as an effective light source upon the pupil plane 10a, and it means that, in a geometrical optics sense, the light rays from the reticle 9 are transformed into oblique incidence light having an eccentric angle and, in response, the principal light ray for the image TPa of the test pattern on the wafer W surface is obliquely incident on the wafer surface. Since the principal light ray of the image is obliquely incident, if the wafer surface level changes by dz, there occurs a positional deviation ds (FIG. 23) with reference to the imaging position assumed when the wafer surface level is registered with the focal point position. Stating inversely, by measuring the positional deviation ds of the image TPa on the test pattern wafer W, the error distance dz through which the wafer surface deviates from the focal point position in Z direction can be detected. In practice, patterns 5a and 6a of FIG. 21 are printed as described above through dual exposure, and any positional deviation of the pattern 5a is measured while taking the pattern 6a position as a reference. Since there is no light blocking pattern on the surface of the pattern 6a, the imaging light of the pattern 6a is not made into oblique incidence to the wafer surface. Thus, even if the wafer surface deviates in Z direction, imaging positional error does not result therefrom.

By using a reticle with test patterns of FIGS. 21 and 22 as described above, high precision focus measurement such as disclosed in Japanese Laid-Open Patent Application, Publication No. 2002-289494 filed by the assignee of the subject application, can be accomplished. The same test reticle may be used for measurement of spherical aberration, and this will be explained below.

Figure 24:
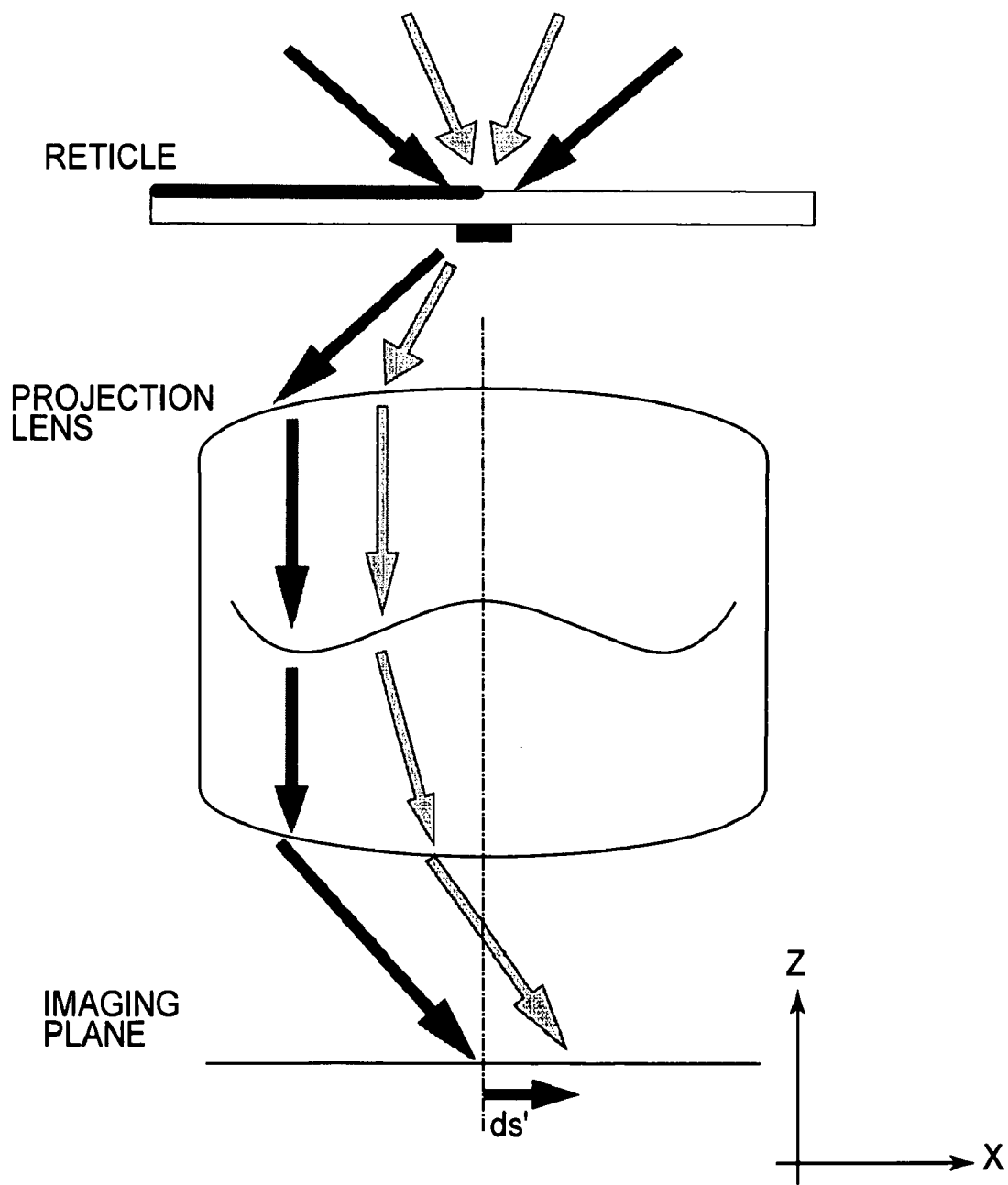
FIG. 24 is a schematic view for explaining the principle of measuring spherical aberration.
Figure 25B:
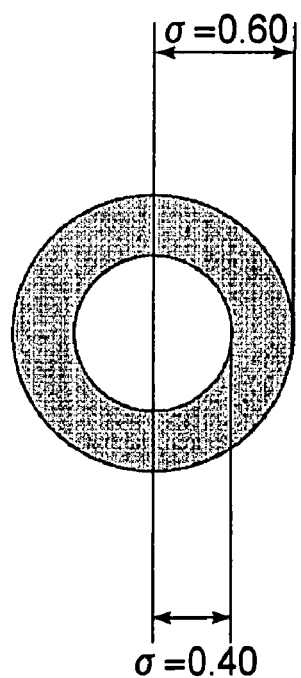

FIG. 24 schematically illustrates the principle of measurement for spherical aberration, using the test reticle of FIGS. 21 and 22. The test reticle is the one shown in FIGS. 21 and 22, and it is illustrated in FIG. 24 in cross-section. As regards the effective light source of illumination light, two types of shapes as shown in FIGS. 25A and 25B are used. While FIGS. 25A and 25B both show ring-like illumination, in FIG. 25A the outside circle has a diameter σ=0.85 and the inside circle has a diameter σ=0.57. In FIG. 25B, the outside circle has a diameter σ=0.60 and the inside circle has a diameter σ=0.40. In FIG. 24, light rays depicted by black arrows correspond to the illumination light of FIG. 25A, while light rays depicted by gray arrows correspond to the illumination light of FIG. 25B. A quaternary curve illustrated inside the projection lens depicts the wavefront shape on the pupil plane in a case where the projection lens has remaining lower-order spherical aberration, that is, Zernike coefficient C9. As shown in FIG. 24, the illumination light projected on the reticle is incidence with a certain solid angle with respect to the reticle surface. However, because of the light blocking pattern AP provided on the bottom surface of the reticle, a portion of the illumination light having a half solid angle is intercepted by the light blocking pattern AP. Thus, only a half of the test pattern TP illumination light can reach the projection lens. In the case of ring-like illumination (blak arrows) of FIG. 25A, these light rays can pass through an outer region of the pupil plane. Since this region corresponds to a zone wherein the wavefront shape change due to term C9 is small, the light rays can be projected through the projection lens and onto the wafer without being influenced by the wavefront shape changed by term C9. Namely, if the wafer surface is registered with the focal plane of the projection lens, the image TPa of the test pattern does not produce positional deviation as shown in FIG. 24. In the case of ring-like illumination (gray arrows) of FIG. 25B, on the other hand, the light rays incident on the projection lens pass through a middle position of the pupil plane. Since zone position corresponds to the position where the wavefront shape changes largely due to term C9, the advancement direction of the light rays is bent and, as shown in figthe position where the wavefront shape changes largely due to term C9, the advancement direction of the light rays is bent and, as shown in FIG. 24, there occurs a positional deviation ds upon the wafer surface. In a case where light is imaged while passing only through a portion of a pupil plane of a projection lens and the produced image causes a positional deviation on the imaging plane, it is known that the amount of positional deviation is proportional to the tilt of the wavefront at the position at which the light passes through the pupil plane. Namely, if the wavefront shape is expressed in terms of Zernike progression $Z_i(\rho, \theta)$, the positional deviation ds' of the image can be expressed by:

$$ds` = k \frac{\partial^2}{\partial \rho \partial \theta} \sum_i Z_i(\rho, \theta) \qquad (7)$$

wherein k is a proportional constant, and (p, θ) is the coordinates upon the pupil plane expressed by polar coordinate. In the case of FIG. 24, the wavefront aberration is based only on term C9. Therefore, equation (7) above can be rewritten as follows.

$$ds'=k(24\rho^3+12\rho) \qquad (8)$$

As discussed above, the positional deviation ds of the image is proportional to the differential function of the wavefront aberration function represented by Zernike progression. This means that, if there is wavefront aberration, the positional deviation of the image to be produced thereby can be intuitively appreciated by considering the tilt of the wavefront at the position on the pupil plane where the illumination light passes through.

Figure 26A:
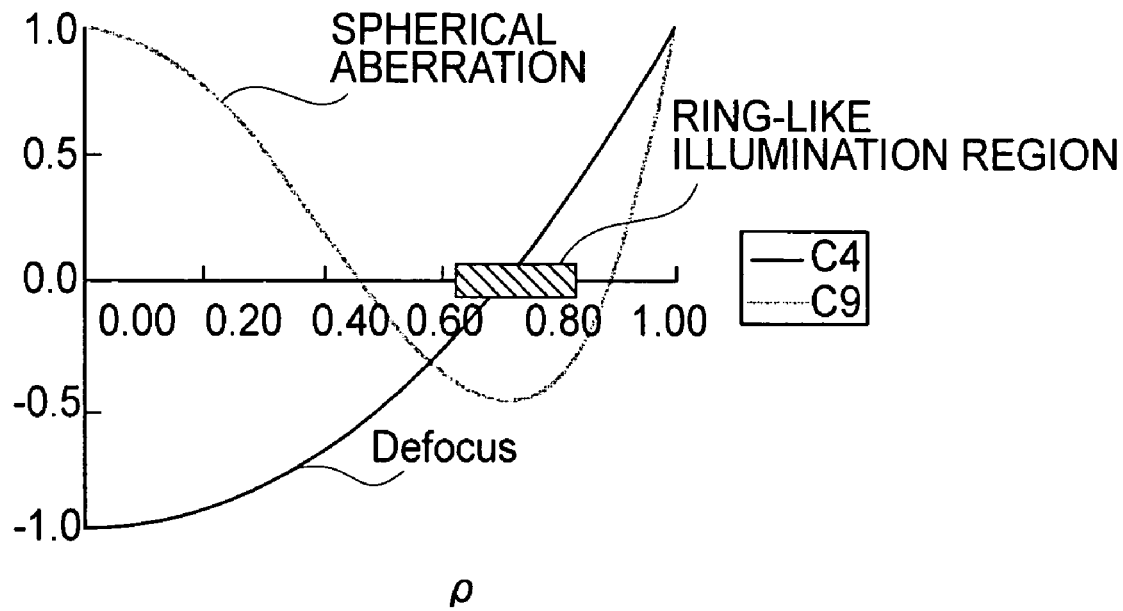
FIGS. 26A and 26B are graphs, respectively, each for explaining the relationship between the wavefront shape and the region of a pupil plane where illumination light of ring-like illumination passes.
Figure 26B:
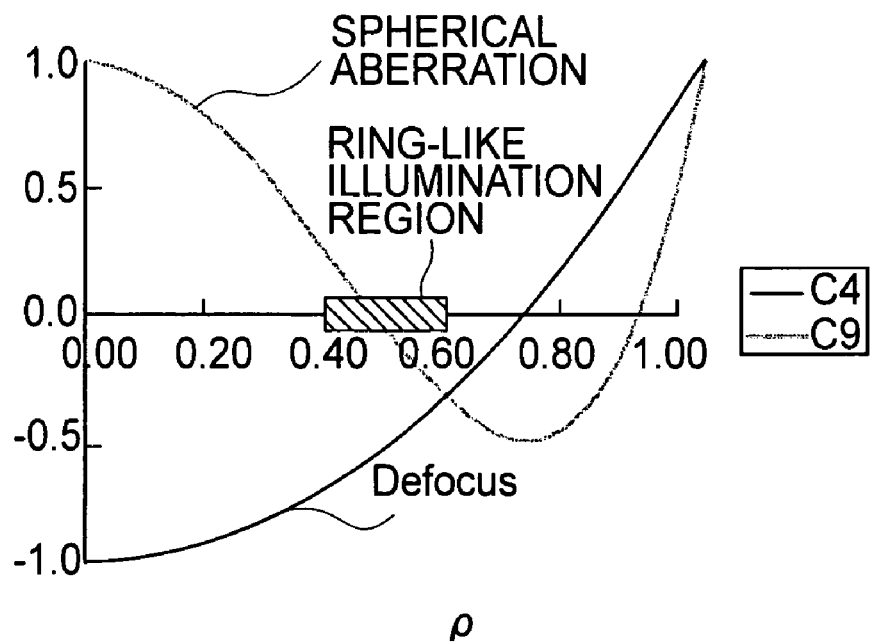

FIGS. 26A and 26B illustrate the relationship between the wavefront aberration shape and the position whereat the illumination light passes through the pupil plane, in cases where a test pattern is illuminated by effective light sources having shapes shown in FIGS. 25A and 25B, respectively. In the graph of FIG. 26, as the spherical aberration, among the Zernike progression, term C4 corresponding to defocus and term C9 corresponding to lower-order spherical aberration are plotted with respect to the coordinate ρ in a radial direction when the coordinates on the pupil plane are expressed in terms of polar coordinate. Also, in these graphs, the position whereat the illumination light passes through the pupil plane, in the cases of effective light sources of FIGS. 25A and 25B, is depicted as a ring-like region. FIG. 26A corresponds to a case wherein illumination is made by use of the effective light source of FIG. 25A. In this case, the zone through which the illumination light is a region wherein the tilt of term C9 is approximately zero, and it can be understood that a positional deviation due to term C9 hardly occurs and a positional deviation contributable to term C4 is produced in proportion to the tilt of term C4. On the other hand, FIG. 26B corresponds to a case of effective light source shown in FIG. 25B and, in this case, in the zone through which the illumination light passes, the tilt of term C4 is positive and the tilt of term C9 is negative. Thus, it can be understood that positional deviations produced by term C4 and term C9 are in opposite directions.

Figures 27A, 27B:
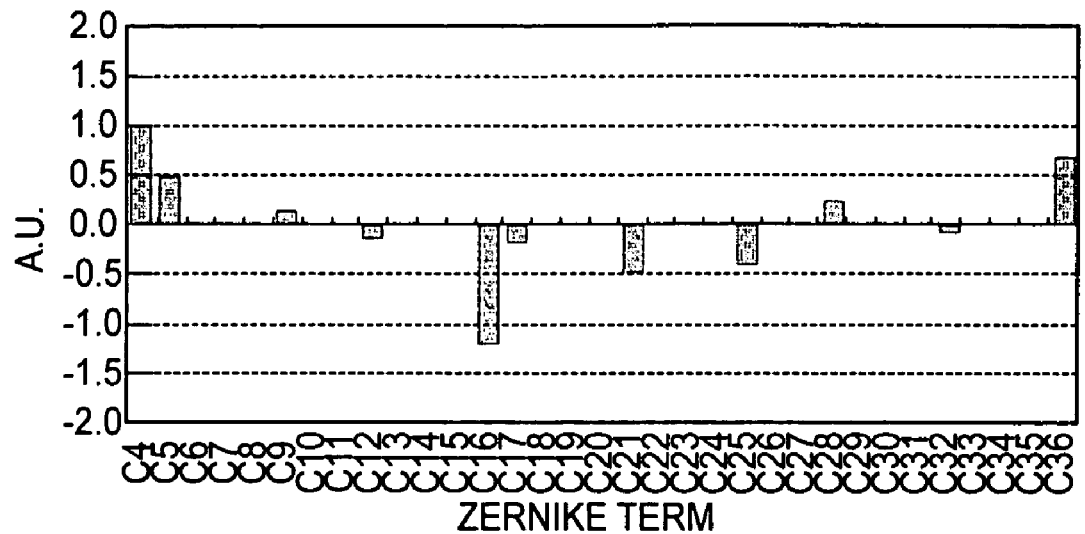
FIGS. 27A and 27B are graphs, respectively, each for explaining the result of calculation for the Zernike sensitivity of a positional deviation amount of an image in the ring-like illumination of FIG. 25A or 25B.

Optical simulations were actually carried out to calculate the sensitivity of the positional deviation amount of an image with respect to the produced amount of wavefront aberration, being expressed by Zernike term, in cases wherein the test pattern of FIG. 3B was illuminated by the effective light sources of FIGS. 25A and 25B. The results are shown in FIGS. 27A and 27B. FIGS. 27A and 27B are graphs illustrating the sensitivity of the positional deviation with respect to Zernike terms, in relative values wherein the sensitivity to tern C4 is taken as 1.0. FIG. 27A shows the results of calculation corresponding to the effective light source shape of FIG. 25A, and it is seen that, as has been explained with reference to FIG. 26A, the positional deviation amount has approximately no sensitivity to term C9. FIG. 27B shows the results of calculation corresponding to the effective light source shape of FIG. 25B, and it is seen that, as has been explained with reference to FIG. 26B, the positional deviations due to term C4 and term C9 have sensitivities in opposite directions. As described with reference to FIG. 20, in projection lenses, generally higher-order aberration components are suppressed during the lens manufacture, such that the focus control in an exposure apparatus can be performed only by controlling term C4 and term C9. In other words, in FIG. 27 the positional deviation sensitivity with respect to higher-order aberration can be disregarded since the aberration amount can be considered as being inherently small. Thus, where the positional deviation amount of the test pattern with the effective light source shape of FIG. 25A is denoted by dsa, the sensitivities of positional deviation to C4 and C9 are denoted by a4 and a9, respectively, the positional deviation amount with the effective light source shape of FIG. 25B is denoted by dsb, and the sensitivities of positional deviation to C4 and C9 are denoted by b4 and b9, respectively, these deviations dsa and dsb can be expressed as follows.

$$dsa = (a4 \times C4) + (a9 \times C9) \quad (9)$$

$$dsb = (b4 \times C4) - (b9 \times C9) \quad (10)$$

wherein C4 and C9 are produced amounts of term C4 and term C9. Furthermore, since the value of a9 is small as compared with a9, b4 and b9, if it is regarded as zero, C4 and C9 can be detected in the following manner.

$$C4 = dsa/a4 \quad (11)$$

$$C9 = (dsb - b4 \times dsa)/b9 \quad (12)$$

By measuring positional deviations of a test pattern resulting from two types of effective light source shapes as described above, the defocus component C4 and the lower-order spherical aberration C9 can be detected separately. Thus, on the basis of measurement results above, and once the results of calculation for the sensitivities with respect to the wavefront aberration at the focal point position in relation to a device pattern and with use of effective light source shapes, such as shown in FIGS. 19A and 19B, are made available, the focal point position with this device pattern can be controlled.

The foregoing description of the present embodiment has been made with respect to an example wherein the ring-like effective light source of FIG. 25A or 25B is defined by use of an aperture stop. However, the effective light source may be formed by use of an optical system or DMD included in the illumination system of an exposure machine, as described hereinbefore, and substantially the same advantageous effects are obtainable. Furthermore, in the test reticle shown in FIG. 21, the test patterns for positional deviation measurement are disposed in cross shape, and therefore it can be used for control of the difference in focus position between a longitudinal pattern and a lateral pattern due to astigmatism.

In FIG. 21, if the test pattern is disposed in an arbitrary angular direction, it can be used to control the focus position of a pattern tilted with an arbitrary angle. Furthermore, if the positional deviation is measured with use of three types or more of effective light sources while taking into account the sensitivity to yet higher order aberration such as C16, for example, aberration attributable to C6 or higher can be controlled.

In the embodiments of the present invention as described hereinbefore, the sensitivity of positional deviation of a test pattern to defocus component or spherical aberration is controlled by changing the diameter of the effective light source of ring-like shape which is frequently used in exposure apparatuses for deformed or distorted illumination. This avoids the necessity of using an illumination stop or stops of special shape such as shown in FIGS. 11 and 12, and the focus position of a projection optical system of an exposure apparatus can be controlled conveniently.

Although the first and second embodiments have been described with reference to an example wherein a test reticle is used, the aberration measurement in the first and second embodiments can be accomplished by providing a test pattern plate disposed inside the exposure apparatus and at a position equivalent to a reticle surface and by providing test patterns on that test pattern plate.

In the aberration measurement according to the embodiments described above, the test patterns are transferred onto a wafer having a photosensitive material applied to its surface, and any positional deviation of the transferred image of the test patterns is measured by use of an overlay measuring machine. As an alternative, the light intensity detecting system 11 provided on the wafer stage 12 may be used, and the imaging position of the test pattern 15 may be measured on the basis of the light intensity detection through the detection system 11 and of the positional information related to the wafer stage 12. Substantially the same advantageous results are obtainable also in that occasion.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2004-112170 filed Apr. 6, 2004, for which is hereby incorporated by reference.

What is claimed is:

1. A method of measuring aberration of a projection optical system, comprising:
    an illuminating step for illuminating a reticle by use of light from an effective light source and through an illumination optical system;
    a projecting step for projecting an image of a test pattern formed on the reticle, upon a substrate through the projection optical system;
    a measuring step for measuring a positional deviation amount of the image of the test pattern formed on the substrate through the projection optical system; and
    a determining step for determining the aberration of the projection optical system on the basis of the positional deviation amount measured at said measuring step;
    wherein said illuminating step includes a shaping step for shaping the light from the effective light source by use of shaping means disposed in the illumination optical system, and by use of a light blocking pattern formed on a first surface of the reticle, remote from a second surface of the reticle where the test pattern is formed,
    wherein, in said shaping step, the light from the effective light source is shaped by the shaping means and the light blocking pattern so that the positional deviation amount of the image of the test pattern depends on a predetermined Zernike coefficient, and
    wherein a central portion of the effective light source is blocked by the shaping means.

2. A method according to claim 1, wherein in said determining step a coefficient of a particular term of Zernike polynomial is determined on the basis of the positional deviation amount measured at said measuring step.

3. A method according to claim 1, wherein the shaping means includes an aperture stop disposed at a pupil plane of the illumination optical system.

4. A method according to claim 3, wherein the aperture stop is formed with a plurality of openings, and wherein the light blocking pattern is adapted to block light passed through at least one of the plurality of openings.

5. A method according to claim 4, wherein the test pattern and the light blocking pattern are provided in a pair, and wherein there are a plurality of pairs of light test patterns and light blocking patterns formed on opposite sides of the reticle.

6. A method according to claim 5, further comprising a plurality of second test patterns formed on the reticle, which second test patterns are provided without a paired relation with the light blocking pattern.

7. A method according to claim 6, wherein said projecting step includes a dual exposure step for the substrate which is to be carried out so that a test pattern provided in a paired relation with a light blocking pattern and a second test pattern provided without a paired relation with a light blocking pattern are superposed one upon another.

8. A method according to claim 1, wherein the shaping means is adapted to change at least one of an inside diameter and an outside diameter of a ring-like effective light source.

9. A method according to claim 1, wherein the test pattern and the light blocking pattern are provided in a pair, and wherein there are a plurality of pairs of light test patterns and light blocking patterns formed on opposite sides of the reticle.

10. A method according to claim 1, wherein the reticle is so placed that the first surface thereof bearing the light blocking pattern is at the illumination optical system side of the reticle, while the second surface thereof baring the test pattern is at the projection optical system side of the reticle.

11. A method of measuring aberration of a projection optical system, comprising:
    an illuminating step for illuminating a reticle by use of light from an effective light source and through an illumination optical system;
    a projecting step for projecting an image of a test pattern formed on the reticle, upon a substrate through the projection optical system;
    a measuring step for measuring a positional deviation amount of the image of the test pattern formed on the substrate through the projection optical system; and
    a determining step for determining the aberration of the projection optical system on the basis of the positional deviation amount measured at said measuring step;
    wherein said illuminating step includes a shaping step for shaping the light from the effective light source by use of shaping means disposed in the illumination optical system, and by use of a light blocking pattern formed on a first surface of the reticle, remote from a second surface of the reticle where the test pattern is formed, and
    wherein, in said shaping step, the light from the effective light source is shaped by the shaping means and the light blocking pattern so that the positional deviation amount of the image of the test pattern depends on a predetermined Zernike coefficient, and the predetermined Zernike coefficient is a coefficient of fourth term or ninth term, wherein, in said shaping step, the shape of the effective light source is made into a ring-like shape by the shaping means while a portion of the effective light source shaped into the ring-like shape is blocked by the light blocking pattern.

* * * * *